United States Patent [19]

van Roermund

[11] 4,443,885

[45] Apr. 17, 1984

[54] CHARGE TRANSFER METHOD AND DEVICE FOR CARRYING OUT THE METHOD

[75] Inventor: Arthur H. M. van Roermund, Eindhoven, Netherlands

[73] Assignee: U.S. Philips Corporation, New York, N.Y.

[21] Appl. No.: 425,148

[22] Filed: Sep. 28, 1982

Related U.S. Application Data

[63] Continuation of Ser. No. 138,027, Apr. 7, 1980, abandoned.

[30] Foreign Application Priority Data

Apr. 17, 1979 [NL] Netherlands .......................... 7902968

[51] Int. Cl.³ ...................... G11C 19/28; H01L 29/78; H03K 3/353
[52] U.S. Cl. ...................................... 377/57; 357/24; 307/304
[58] Field of Search ...................... 357/24; 377/57–63; 307/304

[56] References Cited

U.S. PATENT DOCUMENTS 3,902,186 8/1975 Engeler et al. ...................... 357/24

Primary Examiner—Gene M. Munson
Attorney, Agent, or Firm—Thomas A. Briody; Robert T. Mayer; Steven R. Biren

[57] ABSTRACT

A method and device in which both positive and negative signal charges can be transferred from a first capacitance to a first point via a transistor circuit which exhibits a threshold level. For this purpose the first capacitance contains a reference charge with a positive or a negative polarity. First, the voltage on the first point is switched so that the first capcitance is charged from said first point and subsequently so that the first capcitance discharges towards the first point to its reference charge, which corresponds to said threshold level, in such a way that the net charge transfer from the first capacitance to the first point is equal to the positive or negative signal charge and the charge on the first capacitance is restored to a reference level.

53 Claims, 48 Drawing Figures

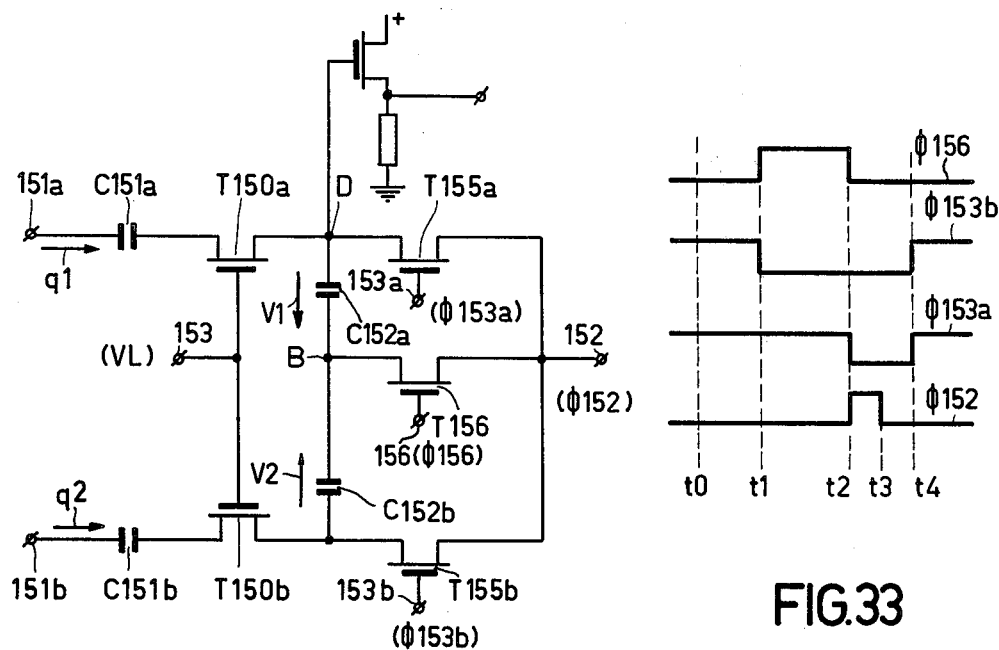
FIG.32
FIG.33
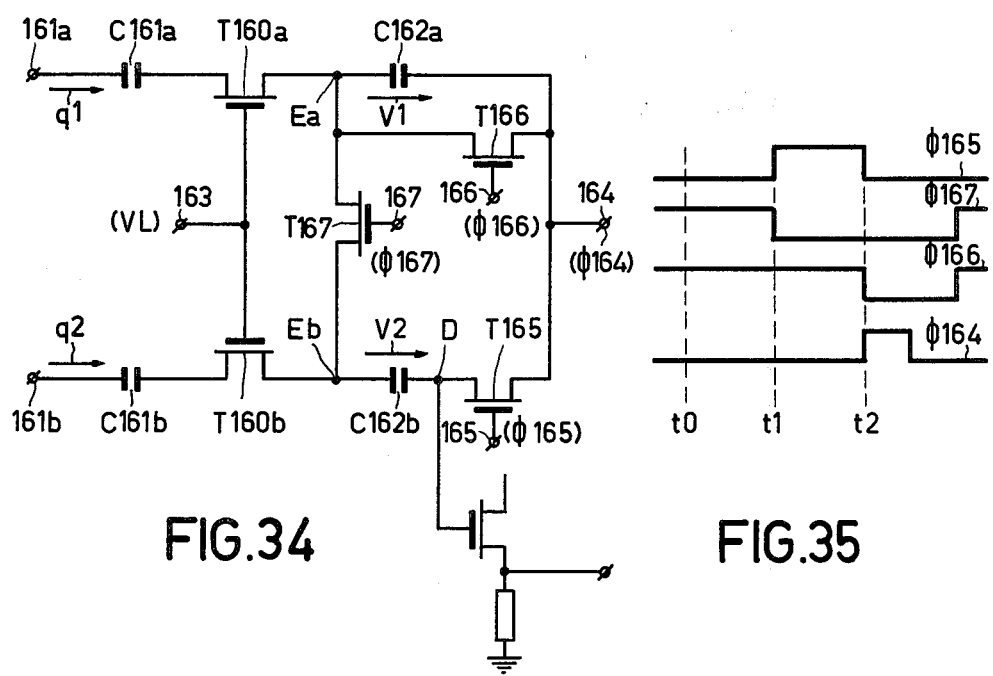
FIG.34
FIG.35

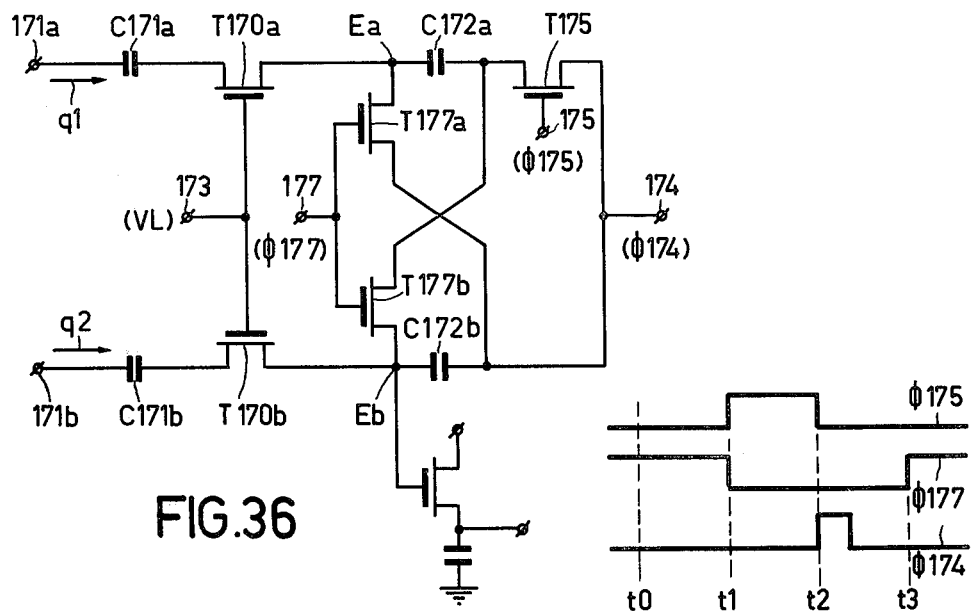
FIG.36
FIG.37
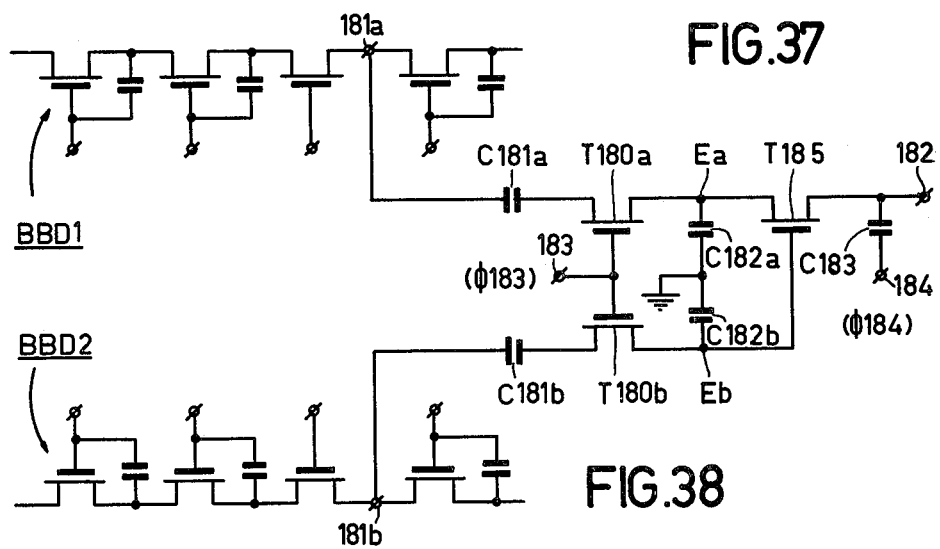
FIG.38
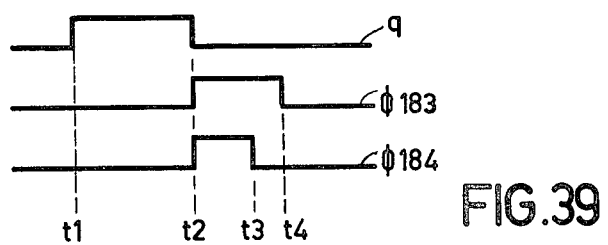
FIG.39

CHARGE TRANSFER METHOD AND DEVICE FOR CARRYING OUT THE METHOD

This is a continuation of application Ser. No. 138,027, filed Apr. 7, 1980, which is now abandoned.

BACKGROUND OF THE INVENTION

The invention relates to a method of transferring charge from a first capacitance to a first point via a transistor circuit which exhibits a first threshold level, at least during said transfer to the first point.

Such a method is inter alia used in the so-called bucket brigade memories (see for example IEEE International Solid State Conference, Feb. 19, 1979, Digest of Technical papers, pages 74, 75 and 185). This known method suffers from the limitation that only charge packets of one specific polarity can be transferred.

Another method of charge transfer is employed in the so-called switched capacitance integrators which are used in integrated filters (for these see for example IEEE, J.S.S.C. vol. SC-13, No. 6, December 1978, pages 906–909). In such integrators, charge packets are formed on a capacitance, which packets are switched to a capacitance which is connected across an operational amplifier for the purpose of negative feedback. Such an integrator inter alia has the drawback that one operational amplifier per integrator is required, which operational amplifier continuously dissipates energy and generates noise and takes up comparatively much space in an integrated circuit.

A third example of the use of the method mentioned above is a charge read-out amplifier which is inter alia employed for the nondestructive readout of charge coupled devices (CCD) (for these, see inter alia IEEE Transactions on electronic devices, Vol. ED-23, No. 2, February 1976, pages 133–142). In this read-out amplifier the mirror charge of an input capacitance flows to a capacitance which is connected across an operational amplifier for the purpose of negative feedback, after which the charge on the negative feedback capacitance can be restored by short-circuiting said capacitance. This known application inter alia has the same drawbacks as the said integrators.

SUMMARY OF THE INVENTION

It is the object of the invention to provide a novel method of the type mentioned above, which enables the transfer of charge packets of both polarities, and which may be used advantageously in various charge transfer devices.

To this end the invention is characterized by a first phase in which the transistor circuit is biased so that charge transfer from the first point to the capacitance is possible in such a way that the first capacitance can be charged to said threshold level from said first point, and a second phase in which the transistor circuit is biased so that the first capacitance can be discharged to said threshold level towards the first point.

The invention is based on the recognition that transfer of charge packets of both polarities is possible by charging the first-mentioned first capacitance from the first point and subsequently discharging it to a level which is determined by the threshold level. Ats each time after the method has been performed the first capacitance is charged again to said threshold level, the net charge transfer during operation of the method is equal to the charge which has been applied to or removed from the first capacitance between two cycles of operation of the method. This means that both positive and negative charge packets can be transferred and that the charge condition of the first capacitance is automatically restored. Additional advantages are—because upon termination of the charge transfer the transistor circuit is not conductive and also because no bias currents are required as is the case when an operational amplifier is used—that the dissipation is minimized and complexity is reduced. As discharging during the second phase is effected over said threshold level until a thermal equilibrium is reached, the noise level attending the charge transfer is very low relative to known methods, employing operational amplifiers.

The invention also relates to a device for carrying out the method, which device is characterized by a first point, a first capacitance, a transistor circuit included between the first capacitance and the first point, and clock signal means for biasing the transistor circuit during a first phase in such a way that charge transfer is effected from the first point to the first capacitance and for biasing the transistor circuit during a second phase in such a way that during said second phase the first capacitance is discharged towards said first point to a threshold level which is determined by the transistor circuit during said second phase. See, for example, FIG. 6.

With respect to the biasing of the transistor circuit the device in accordance with the invention may further be characterized in that the transistor circuit comprises a first transistor with a first and a second main electrode and a control electrode, the first main electrode being connected to the first capacitance, the second main electrode being connected to the first point, and the control electrode being connected to a first source of voltage during at least said second phase for defining said threshold level, the clock signal means comprising a source of switching voltage, which source is coupled to the first point for biasing said first point during the first phase to such a voltage that charge transfer from the first point to the first capacitance is effected and for biasing said first point during the second phase to such a voltage that charge transfer from the first capacitance to said first point is effected over said threshold level. See, for example, FIG. 6.

An alternative possibility may be characterized in that the transistor comprises a first transistor having a first and a second main electrode and a control electrode, the first main electrode being connected to a second point via the first capacitance, the second main electrode being connected to the first point, and the control electrode being connected to a third point, and the clock signal means comprising a first source of switching voltage, which source is coupled to the second and third point for switching the voltage on the second and the third point to such levels during the first phase that charge transfer from the first point to the first capacitance is effected during said first phase and switching the voltage on the second and third point to such levels during the second phase that charge transfer is possible from the first capacitance to the first point, said threshold level being determined by the voltage on the third point during the second phase. See, for example, FIG. 12.

The device in accordance with the invention may suitably be used for restoring charges on capacitances, regardless of the magnitude and polarity of the signal charge. Said first point may then be connected directly to a voltage source which is switched or not. However, if the signal charge transferred is to be maintained, this is possible by adding a capacitor to the first point, on which the charge transferred appears after the method has been applied. Such a device may be employed as an integrator and is then characterized in that a transistor switch is included between a signal charge input and the first capacitance, which switch is coupled to the clock signal means in such a way that during the first and the second phase it is nonconductive and during a phase prior to the first phase, it is conductive. See, for example, FIG. 10.

With the device in accordance with the invention it is alternatively possible to apply a signal to the control electrode of the first transistor, so that said first capacitance is charged to a level determined by said signal after the use of the method in accordance with the invention. Such a device may for example serve as a sampling circuit for sampling charge transferred to a capacitance in accordance with the inventive method and is therefore characterized in that the sampling circuit comprises a second transistor having a control electrode and a first and a second main electrode, the control electrode being connected to the input of the sampling circuit, the first electrode to an output and to a fifth capacitance and the second main electrode to a switching point which is coupled to the clock signal means in such a way that during the third phase the voltage on said switching point is switched so that first charge transfer from said switching point to the fifth capacitance is possible and that subsequently the fifth capacitance of said switching point can be discharged to a level which is determined by a voltage appearing on the input. See, for example, FIG. 20.

For the read out of, inter alia, said CCDs, the device in accordance with the invention may be characterized in that the first capacitance is connected to a signal input with the side facing the first transistor via a third transistor, whose control electrode is connected to a point of fixed voltage, and a third capacitance, said fixed voltage being selected so that during the first phase the third capacitance also receives charge from the first point and during the second phase is discharged to the first point to a level determined by the fixed voltage. See, for example, FIG. 23.

Said third capacitance may then form part of said CCD.

Such a device detects mirror charges of one specific polarity. A device for detecting mirror charges of the other polarity may be characterized in that via a third transistor the first point is connected to a point at such a voltage that when the third transistor conducts, the first and the second capacitance can be charged to said voltage, the control electrode of the third transistor being coupled to the clock signal means for turning on the transistor during a phase which precedes the first phase. See, for example, FIG. 26.

A device in accordance with the invention for the detection of mirror charges of both polarities, as in FIG. 29, may be characterized in that the first point is connected to a fourth point via a third transistor, of which third transistor the control electrode is connected to the clock signal means for turning off the third transistor during the first and the second phase, that a fourth capacitance is connected to the fourth point and that the fourth point is connected to a fifth point via a fourth transistor, the control electrode of the fourth transistor being connected to the clock signal means for turning off said transistor during the first and the second phase, the fourth transistor being turned on during a phase preceding the first phase, and the fifth point receiving such a voltage that the first, second and third capacitances are charged to said voltage above the threshold constituted by the first, third and fourth transistor, after which the voltage on said fifth point is switched to such a value that the first capacitance discharges said fifth point to a threshold level determined by the first transistor, the second capacitance to a level determined by the third transistor and the third capacitance to a level determined by the fourth transistor.

A device in accordance with the invention for detecting a difference between two charges may be characterized by first means for causing signal charge to be applied from a first input to the first capacitance during a third phase preceding the first phase, a second capacitance, second means for causing signal charge to be applied from a second input to the second capacitance during the third phase, switching means for connecting the first and the second capacitance in series during a fourth phase intermediate between the third and first phase, and switching means for coupling the second capacitance to the first point during the first and the second phase. Differential embodiments in accordance with the invention are shown in FIGS. 32 and 34.

An alternative device in accordance with the invention is characterized by first means for causing signal charge to be applied from a first input to the first capacitance during a third phase preceding the first phase, a second capacitance, second means for causing signal charge to be applied from a second input to the second capacitance during the third phase, first switching means for connecting the first and the second capacitance in parallel during a fourth phase intermediate between the first and the third phase, and second switching means for coupling the second capacitance to the first point during the first and the second phase. See, for example, FIG. 36.

In comparison with the preceding device this device has the advantage that the capacitance values of the first and second capacitance need not be equal for determining the difference of two charges.

A very simple device in accordance with the invention for determining the difference between two charges may be characterized by a first signal input, which is coupled to a fourth point between the first capacitance and the first transistor, a second signal input which is coupled to a fifth point, a third capacitance between the fifth point and the second point of fixed potential, the first capacitance being included between said second point of fixed potential and the fourth point, and the fifth point being coupled to the control electrode of the first transistor. See, for example, FIG. 38.

A very simple device in accordance with the invention for detecting both a positive and a negative charge, may be characterized in that the second transistor is included between the first transistor and the first point, by a third transistor between the connecting point of the first and the second transistor, and a third point, which third point is connected to a second point via a third capacitance, that the second capacitance is included between the first point and a fifth point, and that the first capacitance is included between an input terminal and a fourth point, the control electrode of the third transistor being connected to the clock signal means for turning on the third transistor during the third phase. See, for example, FIG. 40.

Such a device may simply take the form of a differential charge amplifier and to this end it is characterized by a first and second device of the last-mentioned type, the second point of each device being connected to the fourth point, which fourth point is connected to said first source of switching voltage, of which first device the first capacitance also constitutes the third capacitance of the second device and the third capacitance also constitutes the first capacitance of the second device, the control electrode of the second transistor of the first device being connected to the control electrode of the third transistor of the second device, and the control electrode of the third transistor of the first device being connected to the control electrode of the second transistor of the second device. See, for example, FIG. 41.

The method in accordance with the invention may also be employed in a delay line, bucket brigade memory or charge coupled device. See, for example, FIG. 43. Such a device is characterized in that this device in conjunction with a plurality of similar devices constitutes a series connection, the first point of each device being coupled to the first capacitance of a subsequent device, the devices alternately belonging to a first and a second group and each group being jointly coupled to the clock signal means, the first phase in the first group following the second phase in the second group and the first phase in the second group following the second phase in the first group.

In this respect it is to be noted that the use of terms like charging and discharging etc. implies no restriction in respect of the type of charge carrier (majority charge carriers or minority charge carriers) or the polarity of the voltages corresponding to said charges.

BRIEF DESCRIPTION OF THE DRAWING

The invention is described in more detail with reference to the Figures, in which:

FIG. 32 shows a first type of differential charge amplifier employing the inventive principle,
FIG. 33 shows the clock signals associated with the circuit of FIG. 32,
FIG. 34 shows a first variant of the circuit of FIG. 32,
FIG. 35 shows the clock signals associated with the circuit of FIG. 34,
FIG. 36 shows a second variant of the circuit of FIG. 32,
FIG. 37 shows the clock signals associated with the circuit of FIG. 36,
FIG. 38 shows a second type of differential charge amplifier employing the inventive principle,
FIG. 39 shows the clock signals associated with the circuit of FIG. 38.

DETAILED DESCRIPTION

Figure 1:
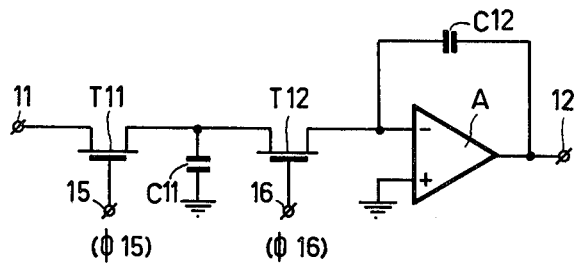
FIG. 1 shows a known integrator circuit.

FIG. 1 shows a known integrator circuit having an input 11 and an output 12. The input 11 is connected to a capacitor C11 via a transistor switch T11, whose control electrode is connected to a switching input 15, to which a clock signal $\phi 15$ is applied. Via a transistor switch T12, whose control electrode is connected to a switching input 16, to which a clock signal $\phi 16$ is applied, said capacitor C11 is connected to the inverting input (−) of an operational amplifier A, whose output is connected to output 12. Said operational amplifier A receives negative feedback via a capacitor C12 between the output and inverting input (−). The noninverting input (+) of operational amplifier A is connected to a point of reference potential (ground in the present example).

Figure 2:
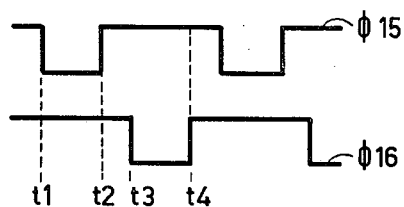
FIG. 2 shows the clock signals associated with the circuit of FIG. 1.

FIG. 2 represents the clock signals $\phi 15$ and $\phi 16$ associated with the circuit arrangement of FIG. 1. At an instant t1 clock signal $\phi 15$ becomes low and transistor T11 is turned on. Capacitor C11 is then charged to the voltage on input 11. Subsequently, at instant t2, transistor T11 is turned off and capacitor C11 contains an amount of charge which is proportional to the input voltage and proportional to the capacitance value of capacitor C11. At instant t3 transistor T12 is turned on and capacitor C11 discharges to the reference potential on the noninverting input (+) as a result of the negative feedback of operational amplifier A. This charge then flows to capacitor C12. Each time that this cycle is repeated an amount of charge proportional to the input voltage is added to the charge present on capacitance C12, so that the voltage on output 12 is the integral of the signal on input 11.

Figure 3:
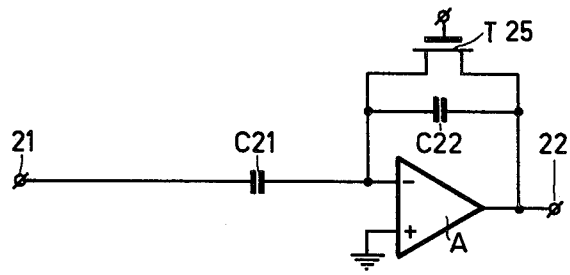
FIG. 3 shows a known charge amplifier.

FIG. 3 shows a known charge amplifier with an input 21 and an output 22. Via a capacitor C21 the input 21 is connected to the inverting input (−) of an operational amplifier A. The output of this operational amplifier A is connected to output 22 and is negatively fed back to the inverting input (−) via a capacitor C22. The noninverting input (+) of the operational amplifier A is connected to a point of reference potential.

A signal voltage V1 on input 21, for example the voltage on a channel tap of a charge coupled device (CCD), capacitor C21 forming part of said CCD, supplies a charge q to capacitor C21 such that: $q = V1 \times C21$. As a result of the negative feedback of operational amplifier A the mirror charge flows to capacitor C22, so that the following is valid for the output voltage V2: $V2 = -V1 \times C21/C22$. By means of transistor T25 the circuit can be reset by short-circuiting capacitor C22.

Figure 4:
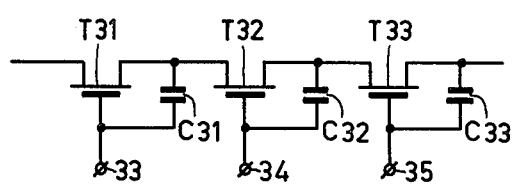
FIG. 4 shows a known bucket brigade memory.

FIG. 4 shows a known charge transfer device, also referred to as bucket brigade memory. It comprises a group of series-connected transistors, three of which, with the reference numerals T31, T32 and T33, being shown. Between the control electrode of each transistor and the connecting point between said transistor and the next transistor there is included a capacitor (C31, C32 and C33 respectively). The control electrodes of the transistors consecutively receive pulses of such a polarity that the relevant transistors are turned on, so that a charge present on a capacitor is transferred to the next capacitor, which is illustrated in FIG. 5.

Figure 5:
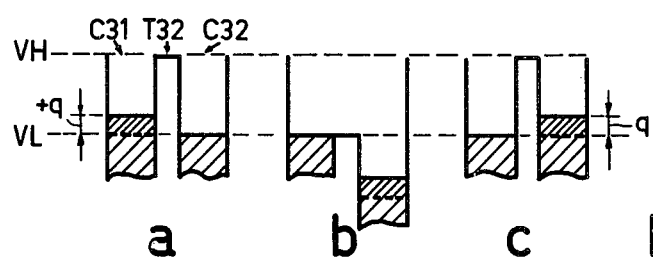
FIG. 5 represents the charge transfer in the circuit in accordance with FIG. 4.

FIG. 5 schematically represents the charge transfer in the device in accordance with FIG. 4. Diagrams a, b and c represent consecutive phases in the charge transfer, the left-hand bar in each diagram representing the charge content of a specific capacitor, for example C31, the center bar the threshold constituted by the transistor, for example T32, which follows said capacitor, and the right-hand bar the charge content of the next capacitor, for example C32. In the absence of a signal all capacitors are charged to a reference level VL. In FIG. 5a it is assumed that capacitor C32 contains a signal charge packet q. If, as is shown in FIG. 5b, the voltage on the control electrode of transistor T32 is reduced to the voltage VL (assuming that the threshold voltage Vth of transistor T32 and all other transistors is 0V for the sake of convenience), so that an equal voltage decrease is obtained on the junction point between transistor T32 and transistor T33 via capacitor C32, the signal charge q will flow to the capacitor C32. Increasing the voltage on the control electrode of transistor T32 resets the circuit to the initial position, after which by means of a pulse on the control electrode of transistor T33 the signal charge packet q can be transferred to capacitor C33.

Figure 6:
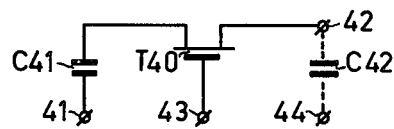
FIG. 6 shows a basic circuit arrangement in accordance with the invention.

FIG. 6 shows the basic diagram of a circuit arrangement employing the charge transfer method in accordance with the invention. This arrangement comprises a capacitance C41 between a point 41 and a transistor T40 which is included between the capacitance C41 and a terminal 42. The control electrode of transistor T40 is connected to a point 43. As the case may be, a capacitance C42, included between point 42 and a point 44, may be added to point 42.

Figure 7:
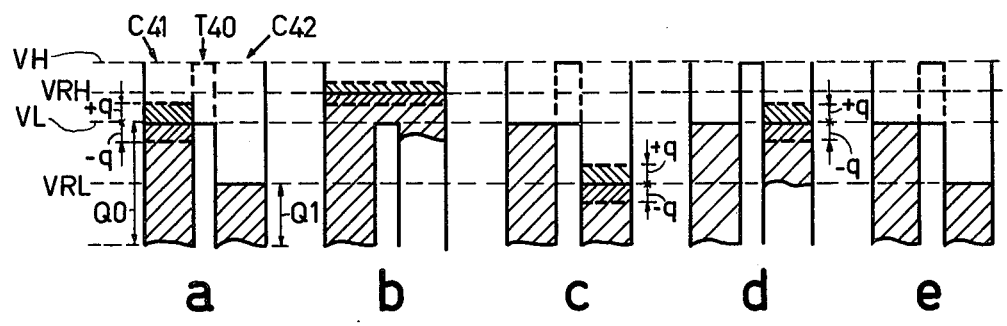
FIG. 7 represents the charge transfer in the circuit of FIG. 6.

The method in accordance with the invention is explained with reference to FIG. 7, FIG. 7a representing the initial situation. In this initial situation capacitor C41 contains a reference charge Q0 with a positive signal charge +q on it (a charge surplus relative to the reference charge Q0) or a negative signal charge −q (a charge deficiency relative to the reference charge Q0) on it. Transistor T40 represents a threshold VL between a capacitor C41 and capacitor C42 in that the voltage on the control electrode connection 43, when ignoring the threshold voltage Vth of the transistor T40 itself, is equal to VL or in that just before the situation shown in FIG. 7a began the voltage on point 43 has been switched from the value VH to the value VL. Capacitor 42 contains a reference charge Q1.

In the situation shown in FIG. 7a a positive signal charge +q, if any, is drained immediately to capacitor C42 over the threshold VL, which is a similar situation as shown in FIG. 5b. A negative signal charge −q will remain in capacitor C41. In order to enable the transfer of negative signal charges a positive voltage pulse is applied to point 44, which via capacitor C42 is transferred to point 42. The situation then obtained is outlined in FIG. 7b. In this situation both capacitor C42 and capacitor C41 are filled with charge above the threshold VL. If subsequently the voltage on point 44 is reduced to the original level, the situation of FIG. 7c is obtained, capacitor C41 being drained to the threshold level of VL, so that:

capacitor C41 is charged to its reference level VL with a reference charge Q0, any positive (+q) or negative (−q) signal charge is transferred from capacitor C41 to capacitor C42.

If a clock signal is applied to the control electrode of transistor T40, said clock signal may be selected so that after the charge transfer process as shown in FIGS. 7a, 7b and 7c the voltage on point 43 is increased, so that an isolation is provided between capacitors C41 and C42. After this the voltage on point 44 may be increased by a voltage VL−VRL, the voltage VRL being the voltage on point 42 when the reference charge Q1 is present on capacitor C42 in the situation of FIG. 7a. This yields the situation of FIG. 7d, in which the charge level in capacitor C42 corresponds to that in capacitor C41 in the situation of FIG. 7a. If desired, voltage amplification may be obtained by selecting the capacitance value of capacitor C42 to be smaller than that of capacitor C41. Indeed, transferring a signal charge q from a capacitor C41 with a capacitance value C1 to a capacitor C42 with a capacitance value C2 means a signal voltage amplification equal to C1/C2.

If the circuit of FIG. 6 is only used for restoring the reference charge Q0 in capacitor C41, capacitor C42 may be dispensed with and a switching voltage, which is switched between the levels VRL and VRH, may be applied to point 42. The situation upon termination of the charge transfer process is then as outlined in FIG. 7e, the reference charge Q0 in capacitor C41 being restored and the signal charge being destroyed (drained to the source from which the switching voltage on point 42 is derived).

The voltage variations shown in FIG. 7 should be considered in relation to each other. Instead of pulsating the voltage on point 42 or 44, it is alternatively possible to maintain said point 42 or 44 at a fixed voltage and to briefly reduce the voltage on point 41 and point 43, so that the charge transfer outlined in FIG. 7 is also obtained.

Figure 8:
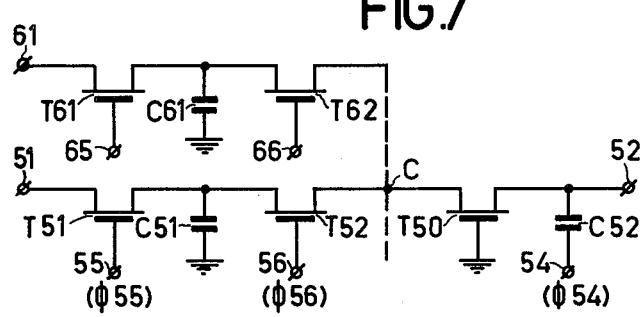
FIG. 8 shows an integrator circuit employing the principle in accordance with the invention.

FIG. 8 shows a first application of the principle in accordance with the invention in a circuit arrangement having a similar function as the known integrator circuit shown in FIG. 1. This circuit arrangement in accordance with FIG. 8 comprises an input 51 and a capacitor C51 with a switching transistor T51 having a control electrode connection 55 between said input and said capacitor. This transistor T51 has a similar function as transistor T11 in FIG. 1, namely applying charge packets, determined by a signal voltage on input 51, to capacitor C51 on command of a clock signal $\phi 55$ on connection 55. Via a transistor T52 with a control electride connection 56 and a transisor T50, whose control electrode is connected to a point of fixed potential, in the present example earth, capacitor C51 is connected to an output 52. Between output 52 and a switching point 54 a capacitor C52 is included.

In the circuit of FIG. 8 transistor T52 performs the same function as transistor T12 in the circuit of FIG. 1, namely transferring the charge on capacitor C51 to capacitor C52, as well as the switching function discussed with reference to FIG. 7 of isolating capacitors C51 and C52 upon termination of the charge transfer process. Transistor T50 performs the same function as transistor T40 in the circuit of FIG. 6, namely the generation of a threshold VL between capacitor C51 and capacitor C52 (when transistor T52 is conductive), the threshold voltage VL corresponding to the threshold voltage Vth of transistor T50 in the case that the control electrode of transistor T50 is connected to earth (0V).

Figure 9:
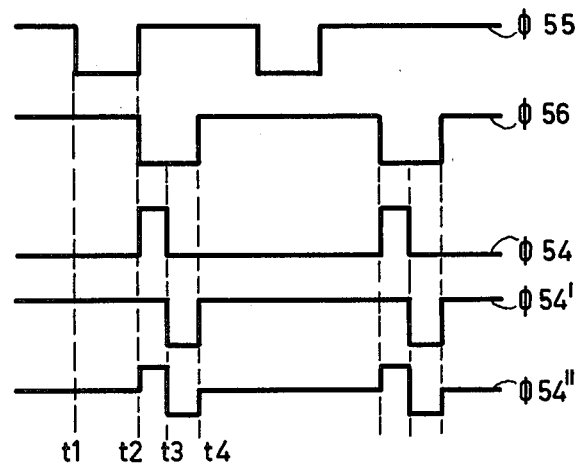
FIG. 9 shows the clock signals associated with the circuit of FIG. 8.

FIG. 9 shows the clock signals $\phi 55$, $\phi 56$ and $\phi 54$ on the switching points 55, 56 and 54 respectively. At instant t1 transistor T51 is turned on, so that capacitor C51 is charged or discharged to the voltage on input 51. At instant t2 transistor T51 is cut off and transistor T52 is turned on, after which the charge transfer process described with reference to FIGS. 6 and 7 can take place. For this purpose the voltage on point 54 is increased by means of clock signal $\phi 54$ at said instant, which instant is noncritical and may appear earlier or later. As a result of this, charge is transferred from capacitor C52 to capacitor C51 over the threshold VL so as to replenish a negative signal charge −q, if any—the situation corresponding to the situation shown in FIG. 7b. At instant t3 the voltage on point 54 is reduced again, so that capacitor C51 discharges to the threshold level VL—the situation after this corresponds to the situation shown in FIG. 7c. At the instant t4, which should appear a sufficient time after the instant t3 to allow capacitor C51 to discharge completely to the level VL, transistor T52 is turned off by means of the clock signal $\phi 56$. At this instant the positive or negative signal charge present in capacitor C51 at the instant t2 is added to the charge already present in capacitor C52 and the charge in capacitor C51 is restored to the reference level Q0. The function of the circuit arrangement in accordance with FIG. 8 thus entirely corresponds to that of the circuit arrangement in accordance with FIG. 1, while the operational amplifier A has been dispensed with with all the consequent advantages such as:

smaller dissipation
less components required
less noise.

During the periods that transistor T52 is not conductive the clock signal $\phi 54$ may exhibit levels other than those shown in FIG. 9, provided that this does not cause transistors T50 and T52 to be turned on. As an example it is possible to leave $\phi 54$ "high" during said periods, yielding the clock signal $\phi 54'$ shown, which has the advantage that the voltage level on output 52 is "high" during said periods, which may be advantageous for sampling the signal on output 52 or, as the case may be, a further transfer of the signal charge. In order to prevent transistors T50 and T52 from being turned on a voltage pulse may then be applied to the control electrode of transistor T50. An other possibility is to bring the clock signal at a reference level during said periods, which level corresponds to an output voltage around the level VL shown in FIG. 7, yielding a situation as shown in FIG. 7d at the end of a read-out period after the instant t4. Such a clock signal $\phi 54''$, which is shown in FIG. 9, has the advantage that the reference levels on input 51 and output 52 are the same.

In the case of integrators it may be desirable to integrate a plurality of signals together. In the arrangement of FIG. 8 this is inter alia possible by coupling a plurality of input circuits, such as the circuit shown with input 61, transistors T61 and T62 and capacitor C61, to the connecting point C between transistor T52 and transistor T50. The signal charges on capacitors C51 and C61 may be transferred to capacitor C52 by turning on transistors T52 and T62 and applying a pulse to point 54.

Figure 10:
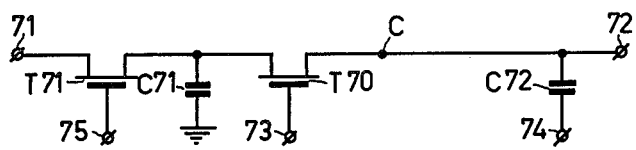
FIG. 10 shows a first variant of the circuit of FIG. 8.

FIG. 10 shows a variant of the circuit of FIG. 8, transistors T52 and T50 being replaced by one transistor T70. This circuit operates in a similar way as that of FIG. 8, with the proviso that the threshold VL, which in the circuit of FIG. 8 is constituted by the threshold level of transistor T50, is constituted by the "low" level of the clock signal applied to the control electrode of transistor T70 in the circuit of FIG. 10.

Figure 11:
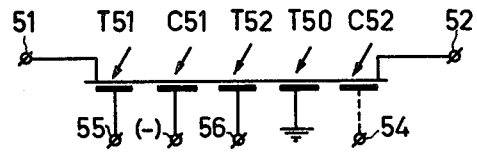
FIG. 11 shows a transistor structure for use in the circuit of FIG. 8.

In the circuit arrangements in accordance with the invention, technologies known from charge-coupled devices (CCD) may be used, namely arranging a plurality of control electrodes on one channel, thus forming the various transistors and capacitors (channel/control electrode capacitance). FIG. 11 shows such a possibility for the circuit of FIG. 8, five control electrodes being arranged on one channel between input 51 and output 52, so that capacitors C51 and C52 and transistors T51, T52 and T50 are formed. The electrode corresponding to capacitor C51 should then be connected to a negative voltage (−) so that it can also contain negative signal charges; this is because the channel in the present example is of the p-type. With the circuit of FIG. 8 it is for example also possible to replace the transistors T50 and T52 by a single transistor with two control electrodes on one channel.

Figure 12:
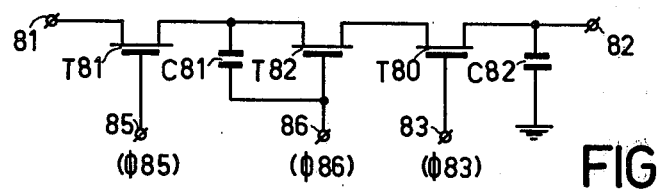
FIG. 12 shows a second variant of the circuit of FIG. 8.

FIG. 12 shows a variant of the circuit of FIG. 8, capacitor C81 being pulsed instead of capacitor C82. The circuit is identical to that of FIG. 8, with the proviso that capacitor C81 is connected to the control electrode of transistor T82 instead of to ground, that capacitor C82 is included between output 82 and a point of fixed potential, for example ground, and that the control electrode of transistor T80 is connected to a switching point 83.

Figure 13:
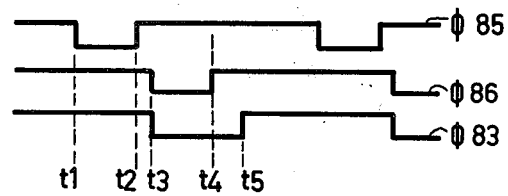
FIG. 13 shows the clock signals associated with the circuit of FIG. 12.
Figure 14:
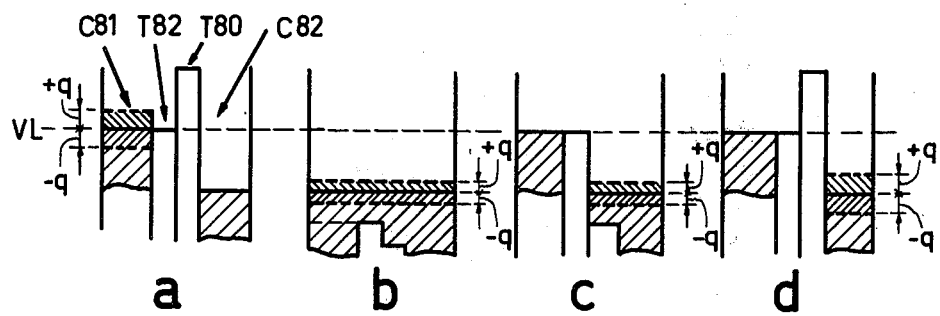
FIG. 14 represents the charge transfer in the circuit of FIG. 12.

In order to illustrate the operation of the circuit of FIG. 12, FIG. 13 reesents the time relationship between the clock signals $\phi85$, $\phi86$ and $\phi83$ on points 85, 86 and 83 respectively and FIG. 14 the charge condition after the instants t2, t3, t4 and t5 respectively. Between the instants t1 and t2 transistor T81 is conductive and a positive (+q) or negative (−q) signal charge may be applied to capacitor C81 (FIG. 14a). At instant t3 the voltages on points 86 and 83 are reduced, so that the thresholds of transistors T82 and T80 drop below the charge level on capacitor C82 and charge transfer to the left is possible (FIG. 14b), which charge transfer to the left does not take place in reality when capacitor C81 contains such a large positive signal charge that it exceeds that on capacitor C82. At the instant t4 the voltage on point 86 is raised, so that capacitor C81 is drained over the threshold constituted by transistor T82 in the case of a "high" clock signal $\phi86$, so that the reference charge on capacitor C81 is restored and the signal charge has flown to capacitor C82 (FIG. 14c). At instant t4 transistor T80 is turned off so as to isolate capacitors C81 and C82 (FIG. 14d).

In a similar way as with the circuit of FIG. 8 several variants to the circuit of FIG. 12 are possible, inter alia with respect to clock signals and the like.

Figure 15:
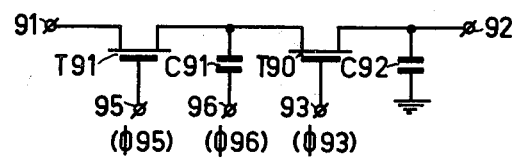
FIG. 15 shows a third variant of the circuit of FIG. 8.

FIG. 15 shows such a variant, in which in comparison with FIG. 12 the transistors T80 and T82 have been combined to one transistor T90, capacitor C91 no longer being connected to the control electrode of transistor T90 but to a separate switching point 96.

Figure 16:
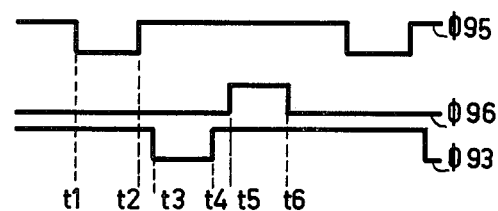
FIG. 16 shows the clock signals associated with the circuit of FIG. 15.
Figure 17:
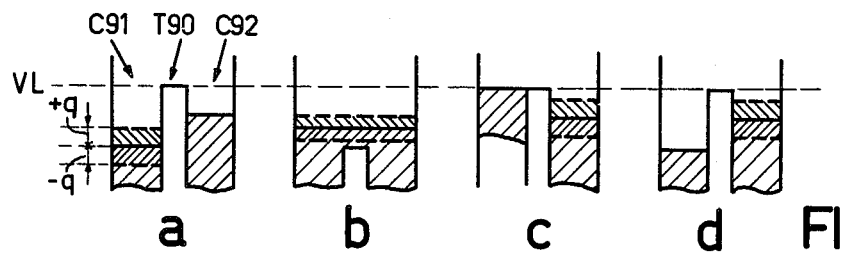
FIG. 17 represents the charge transfer in the circuit of FIG. 15.

In order to illustrate the operation of the circuit of FIG. 15, FIG. 16 shows the clock signals $\phi95$, $\phi96$ and $\phi93$ on points 95, 96 and 93 respectively and FIG. 17 the charge condition after the instants t2, t3, t5 and t6 respectively. Between the instants t1 and t2 transistor T91 is conductive and signal charge can be applied to capacitor C91 (FIG. 17a). At instant t3 the voltage on the control electrode of transistor T90 is reduced, so that charge can flow from capacitor C92 to capacitor C91 (FIG. 17b). At instant t4 the voltage on the control electrode of transistor T90 is raised, after which by means of clock signal $\phi96$ the voltage on point 96 is increased, so that capacitor C91, over the threshold VL of transistor T90 associated with the "high" level of clock signal $\phi93$, discharges to the reference level and the signal charge is transferred to capacitor C92 (FIG. 17c). Instant t5 may then coincide with instant t4. At instant t6 the voltage on point 96 decreases and capacitor C91 is again at the original level and isolated from capacitor C92 (FIG. 17d).

Figure 18:
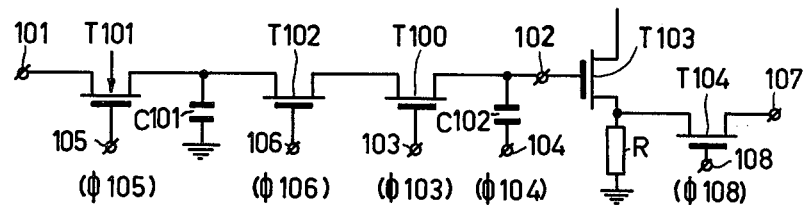
FIG. 18 shows a circuit of FIG. 8 with a read-out circuit.

FIG. 18 shows a possibility of sampling the output signal of a circuit in accordance with the invention. Between input 101 and output 102 the circuit is fully identical to the circuit of FIG. 8, except for the connection from the control electrode of transistor T100 to a switching point 103. The output 102 is connected to the control electrode of a transistor T103, which includes a resistor R in the source electrode circuit. The source electrode of transistor T103 is connected to a further output 107 via a sampling transistor T104, whose control electrode is connected to a switching point 108.

Figure 19:
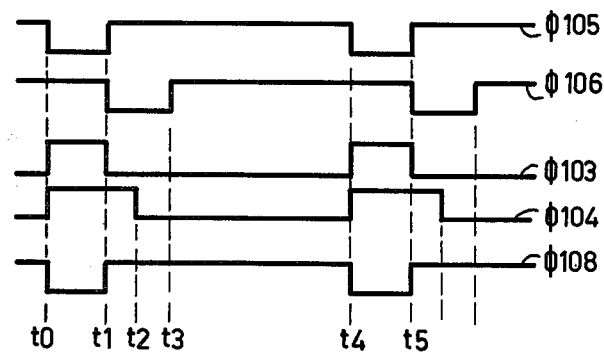
FIG. 19 shows the clock signals associated with the circuit of FIG. 18.

In order to illustrate the operation of the sampling method in accordance with FIG. 18, FIG. 19 shows the clock signals $\phi105$, $\phi106$, $\phi103$, $\phi104$ and $\phi108$ on points 105, 106, 103, 104 and 108 respectively. Between the instants t0 and t1 the voltage on point 104 is raised, which means a level shift on output 102, the voltage on the control electrode of transistor T100 being also raised so as to prevent a charge transfer to the left. Between these instants transistor T104 is, moreover, conductive, so that the signal voltage on output 102 is available on output 107. This sampling period t0 and t1 may also be used for applying a new signal charge to capacitor C101, for which purpose transistor T101 is conductive between the instants t0 and t1. After instant t1 signal charge transfer from capacitor C101 to capacitor C102 is possible as described previously in that at instant t1 the voltage on the control electrode of transistor T101 is reduced for the formation of the threshold VL and transistor 102 is turned on while the voltage on point 104 is high, so that charge transfer to the left is effected. At instant t2 the voltage on point 104 decreases, so that capacitor C101 discharges over threshold VL and at instant t3 transistor T102 is turned off, after which a new sampling may be performed.

Figure 20:
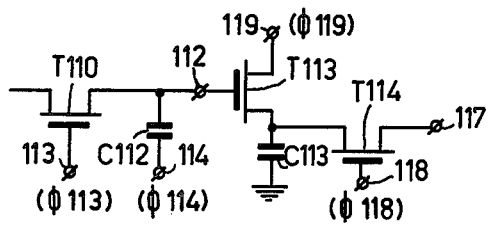
FIG. 20 shows a dynamic sampling circuit employing the principle of the invention.

The static sampling of FIG. 18 with source resistor R may be replaced by a dynamic sampling in accordance with FIG. 20.

In the circuit of FIG. 20 the output 112 of a charge transfer device, for example in accordance with FIG. 8, is connected to the control electrode of the transistor T113, whose one main electrode is connected to a terminal 119 and whose other main electrode is connected to a point of fixed voltage (ground) via a capacitance C113. Said other electrode is also connected to an output 117 via a sampling transistor T114 with a control electrode connection 118. FIG. 20 only shows the transistor T110 and the output capacitance C112 of the charge transfer circuit.

The read-out transistor T113 operates fully in accordance with the principle outlined with reference to FIGS. 6 and 7, with the proviso that capacitance C113 corresponds to capacitance C41, terminal 119 corresponds to terminal 42 and output 112 to terminal 43. Thus, in the circuit of FIG. 20 capacitance C113 is discharged to a threshold level each time after a pulse has been applied to point 119, which level, when ignoring the threshold voltage Vth of transistor T113 itself, corresponds to the signal on output 112.

Figure 21:
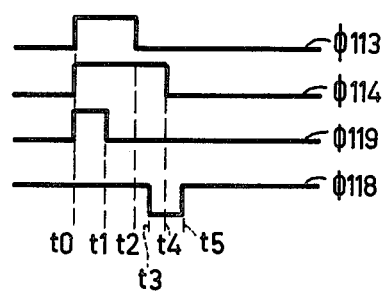
FIG. 21 shows the clock signals associated with the circuit of FIG. 20.
Figure 22:
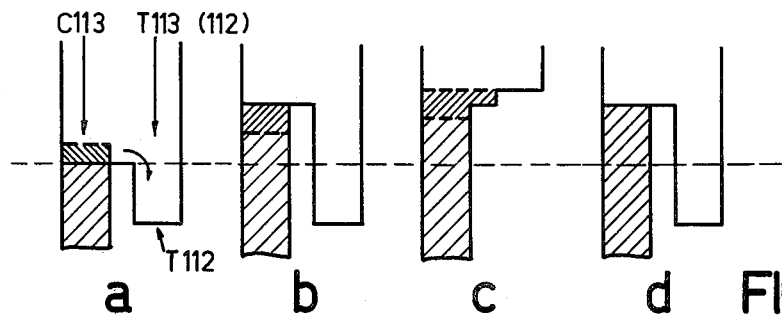
FIG. 22 represents the charge transfer in the circuit of FIG. 20.

This is illustrated with reference to FIG. 21, which shows the clock signals $\phi113$, $\phi114$, $\phi119$ and $\phi118$ on points 113, 114, 119 and 118 respectively and FIG. 22 which shows a number of charge situations. At instant t0 the voltage on point 13 is increased, so that transistor T110 is cut off and at the same instant the voltage on point 114 is raised in order to obtain a shift of the level of the signal on output 112. The situation is then as shown in FIG. 22a when the signal on point 112 exceeds the charge level on capacitor C113 and, as is shown in FIG. 22b, when the voltage on point 112 (which determines the threshold level of transistor T113) exceeds the charge level on capacitor C113. At this same instant t0 (or as the case may be later) the voltage on point 119 is raised, so that capacitor C113 is charged to said voltage on point 119 (FIG. 22c). At instant t1 the voltage on point 119 is reduced, so that capacitor C113 discharges to the level determined by the voltage on output 112 (FIG. 22d). After instant t2 capacitor C113 has thus been charged to the voltage on output 112 (minus the threshold voltage Vth of transistor T113). After this the voltage on point 113 decreses so as to apply a new signal to capacitor C112 and the voltage on point 114 remains high so as to cause a charge transfer from capacitor C112 to the left. At instant t4 the voltage on point 114 descreases, so that a new signal charge flows to capacitor C112. After instant t2, for example between instants t3 and t5, transistor T114 is turned on in order to transfer the signal to output 117 via capacitor C113.

Figure 23:
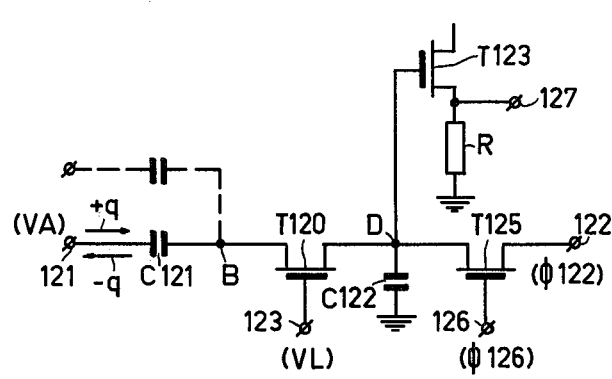
FIG. 23 shows a charge amplifier employing the principle of the invention.

FIG. 23 shows a charge read-out and restoration circuit, which may for example be employed for the non-destructive read-out of charge coupled amplifiers and which in respect of its function corresponds to the circuit of FIG. 3.

The circuit comprises an input 121 to which a charge +q may be appllied, followed by a charge −q, so that per cycle no charge is extracted from a source connected to input 121. via a capacitor C121 input 121 is connected to a transistor T120 whose control electrode is connected to a point of constant voltage VL. On the other hand, transistor T120 is connected to a point D which via a capacitor C122 is connected to a point of constant potential (ground). Furthermore, point D is connected to a switching point 122 via transistor T 126, whose control electrode is connected to a switching point 123.

Figure 24:
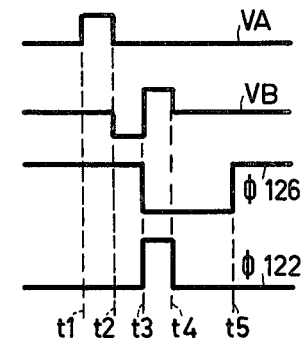
FIG. 24 shows the clock signals associated with the circuit of FIG. 23.
Figure 25:
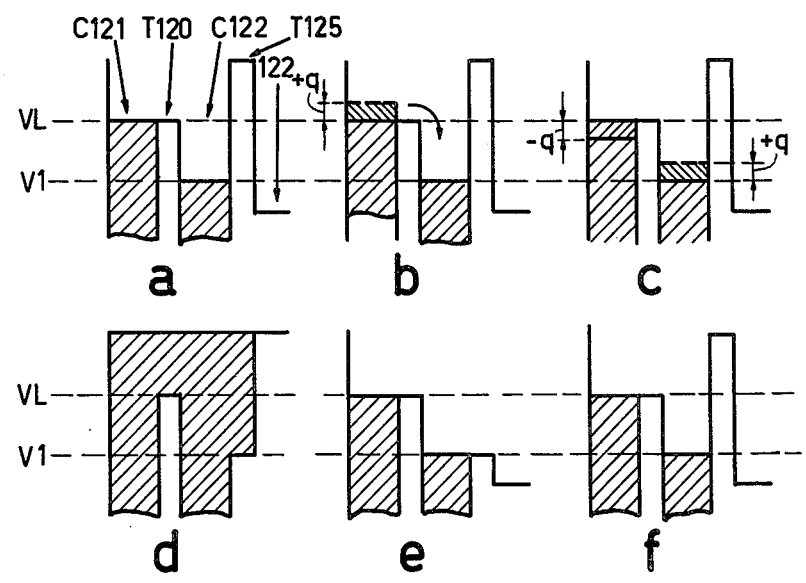
FIG. 25 represents the charge transfer in the circuit of FIG. 23.

FIG. 24 shows the signal VA on input 121, the voltage on point B and the clock signals on points 123 and 122, and FIG. 25 shows the charge situations at the instant t1 and, after the instants t1, t2, t3, t4 and t5 respectively. At instant t1 the circuit is in an initial situation, the electrode of capacitor C121 which is connected to transistor T120 being charged to a reference level which, when ignoring the threshold voltage Vth of transistor T120 itself, corresponds to the voltage VL, and capacitor C122 to a reference level V1, which corresponds to the threshold constituted by transistor T125 at a low level of clock signal φ126 (FIG. 25a). At instant t1 a charge +q ((FIG. 25b) is applied to input 121. The corresponding mirror charge flows to capacitor C122 over the threshold constituted by transistor T120. At instant t2 the voltage VA on input 121 is restored to the original level. As capacitor C121 has been discharged until point B carries a voltage VL, the charge q cannot be drained, because transistor T120 then cuts off and the voltage on point B decreases to a voltage corresponding to a charge −q. The situation then obtained is shown in FIG. 25c. At instant t3 transistor T125 is turned on and forms a threshold voltage V1 netween capacitor C122 and point 122. To point 122 a positive voltage pulse is applied. The situation then obtained is shown in FIG. 25d, in which capacitors C121 and C122 have been charged to the high level on point 122. At instant t4 the voltage on point 122 decreases, so that capacitors C121 and C122 respectively discharge over threshold VL and V1 (FIG. 25e); the net charge then transferred to capacitor C121 is then equal to q and a charge equal to q flows back to the input 121. If at instant t5 transistors T125 is turned off, the initial situation ((FIG. 25f) is restored. Thus, the charge condition of the circuit is restored without extracting charge from a source connected to input 121. The positive signal charge can be sampled between instants t2 and t3. For this purpose a source follower with transistor T123 and source resistor R is connected to point D. The source signal on point 127 can then be sampled between instants t2 and t3, for example in a similar way as was effected in the circuit of FIG. 18. Instead of the sampling circuit used in FIG. 23 the dynamic sampling circuit of FIG. 20 may be employed.

In the circuit of FIG. 23 charges from several sources may be added for examle by connecting point B between capacitor C121 and transistor T120 to a plurality of inputs, each via a capacitor.

Figure 26:
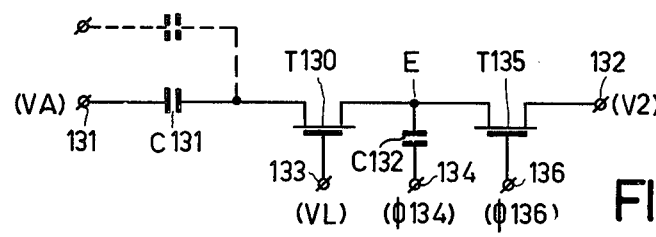
FIG. 26 shows a first variant of the circuit of FIG. 23.

In the circuit of FIG. 23 the positive signal charge +q can be detected. FIG. 26 shows a similar circuit, however adapted to detect the negative signal charge −q. In comparison with the circuit of FIG. 23, capacitor C132 is connected to switching point 134 and point 132 is connected to a point of reference voltage V2 in the circuit of FIG. 26.

Figure 27:
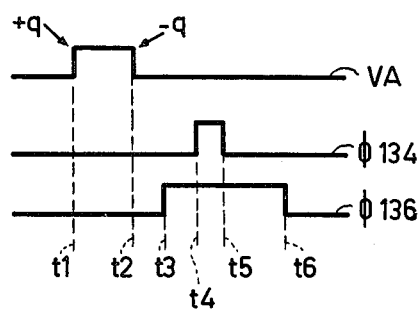
FIG. 27 shows the clock signals associated with the circuit of FIG. 26.

FIG. 27 shows the input signal VA and the clock signals φ134 and φ136 on points 134 and 136.

Figure 28:
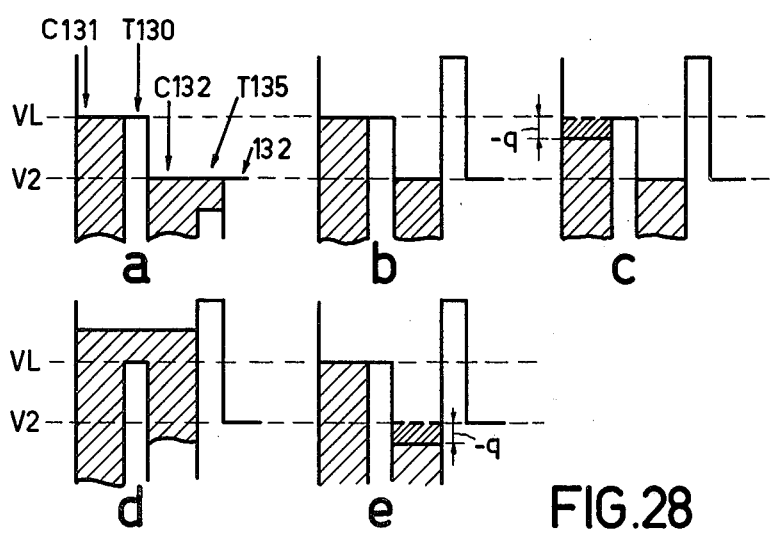
FIG. 28 represents the charge transfer in the circuit of FIG. 26.

FIG. 28 shows the charge situation prior to the instant t1, at the instant t3, prior to instant t4, after instant t4 and after the instant t5 respectively. At instant t1 capacitors C131 and C132 are charged to a reference level VL and V2 respectively and transistor T135 is conductive (FIG. 28a). A positive charge applied between instants t1 and t2 flows to point 132 over the threshold VL constituted by transistor T130. After instant t2, at instant t3, transistor T135 is turned off (FIG. 28b). A negative signal charge −q is taken from capacitor C131 at instant t2 (or later, at any rate prior to instant t4) (FIG. 28c). At instant t4 a positive voltage pulse is applied to point 134, so that capacitor C131 is charged (FIG. 28d). At instant t5 the voltage on point 134 decreases and capacitor C131 discharges to the level VL and the negative signal charge −q has been transferred to capacitor C 132 (FIG. 28e). At instant t6 transistor T135 is turned on again, so that capacitor C132 is charged to the level V2 and the circuit is restored to its initial levels (FIG. 28a). Detection of the negative signal charge on point E may be effected in a similar way as in the circuit of FIG. 22, viz. between instants t5 and t6.

Figure 29:
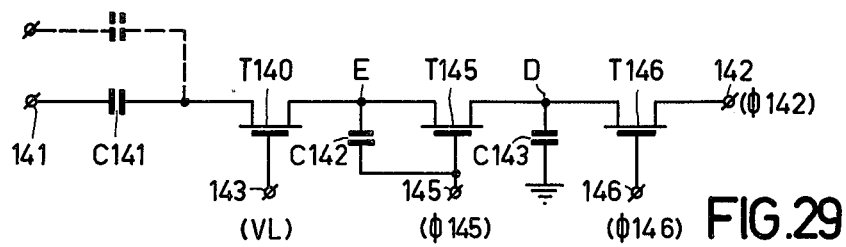
FIG. 29 shows a second variant of the circuit of FIG. 23.

FIG. 29 shows a combination of the circuits of FIGS. 23 and 26, which enables both the positive charge signal charge +q and the negative signal charge −q to be detected. The circuit comprises a capacitor C141 between input 141 and a transistor T140. Transistor T140 is moreover connected to a point E which is connected to switching point 145 via capacitor C142. The control electrode of transistor T140 is connected to a point 143 carrying a constant voltage VL. Via a transistor T145 point E is connected to a point D, the control electrode of transistor T145 being connected to switching point 145. Via capacitor C143 point D is connected to a point of reference potential (ground) and (via a transistor T146, whose control electrode is connected to a switching point 146 to a switching point 142.

Figure 30:
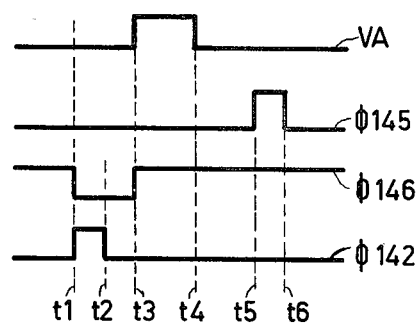
FIG. 30 shows the clock signals associated with the circuit of FIG. 29.
Figure 31:
FIG. 31 represents the charge transfer in the circuit of FIG. 29.
Figure 31:
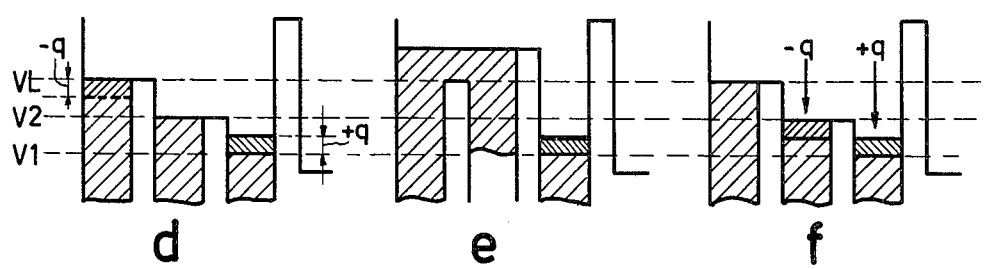

FIG. 30 shows an input signal VA on input 141 and the clock signals on switching points 145, 146 and 142 and FIG. 31 shows the charge situation after the instant t1, at the instant t3, after the instant t3, after the instant t4, after the instant t5 and after the instant t6. The circuit is reset by applying a positive voltage pulse to point 142 at instant t1, transistors T145 and T146 being conductive (FIG. 31a). At instant t2 the voltage on point 142 is reduced, so that capacitor C141 discharges to the level VL determined by transistor T140, capacitor C142 to the level V2 determined by transistor T145 at "low"

level of the clock signal φ145, capacitor C143 to the level V1 determined by transistor T146 at "low" level of clock signal φ146, after which at instant t3 transistor T146 is turned off (FIG. 31b). After instant t4 a positive charge +q is applied to capacitor C141, the corresponding mirror charge flowing to capacitor C143 via transistors T140 and T145 (FIG. 31c). After instant t4 the negative signal charge −q is applied to capacitor C141 (FIG. 31d). At instant t5 the voltage on point 145 is raised, so that capacitor C141 is charged (FIG. 31e). At instant t6 the voltage on point 145 decreases again and the negative charge −q of capacitor C141 is transferred to capacitor C142 (FIG. 31f). Briefly after instant t6 the positive signal charge appears in capacitor C143 and the negative signal charge in capacitor C142, after which the two signals can be sampled. The charge condition may then be restored by turning on transistor T146 and applying a positive voltage pulse to point 142.

FIG. 32 shows a differential charge amplifier for detecting the difference between two positive signal charges q1 and q2. Essentially, the circuit comprises two circuits in accordance with FIG. 23, input 151a, capacitor 151a, point 153, transistors T150a, capacitor C152a, transistor T155a, point 153a and point 152 respectively and input 151b, capacitor C151b, point 153, transistor T150b, capacitor 152b, transistor 155b, point 153b and point 152 in the circuit of FIG. 32 respectively corresponding to input 152, capacitor C121, point 123, transistor T120, capacitor C122, transistor T125, point 123 and point 122. However, capacitors C152a and C152b and connected to a point B. This point B is connected to point 152 via transistor T156. The control electrode of the transistor T156 is connected to point 156, to which a clock signal φ156 is applied.

FIG. 33 shows the clock signals φ156, φ153b, φ153a and φ152 on points 153b, 153a, and 152 respectively. At an instant t0 the circuit is in its initial state. The voltage on point 152 is then low and transistors T155a and T155b are cut off and transistor T156 conducts. During a restoration phase preceding said instant point B is discharged to the low level of point 156 (ignoring the threshold voltage Vth of said transistor T156) via transistor T156. Consequently, transistor T156 is just not conductive. If after the instant t0 a positive signal charge q1 or q2 is applied to inputs 151a and 151b respectively the corresponding mirror charge will flow to capacitor C152a or C152b respectively as described with reference to FIGS. 23–25, causing a signal voltage V1 and V2 across the respective capacitors; the charging currents then flow to point 152 via transistor 156. A subsequently-appearing negative signal charge remains present on capacitor C151a and C151b respectively. At instant t1 transistor T155b is turned on and transistor T156 is turned off. As a result of this the point between transistor T150b and transistor T155b adopts the low potential of point 153b (ignoring the threshold voltage Vth of the transistor) and the voltage on point B decreases by V2. Transistor T156 is then turned off and capacitors C152a and C152b are then connected in series between point 153b and point D between transistor T150a and transistor T155a. The signal voltage on point D then becomes V1−V2 at said instant t1, which signal voltage can be sampled as described with reference to FIG. 18 or FIG. 20. At instant t2 transistor T155a and T156 are turned on, while transistor T155b remains conductive. The voltage on point 152 is increased at this instant and is reduced again at instant t3, so that capacitors C151a, C151b, and C152b are restored to a reference level in the manner described with reference to FIGS. 22–24, point B being restored via transistor T156. At instant t4 transistors T155a and T155b are turned off again, after which a new detection can be affected. Point D and the point between transistors T150b and T155b can also be restored to the voltage on point 152 at a low level of clock signal φ152, while transistor T155b can be turned on during read-out in such a way that the series connection of capacitors C152a and C152b is included between point D and point 152. In addition, the voltage VL may be a switched voltage, which equally applies to, for example, the embodiments in accordance with FIGS. 23–34 and 40 and 41.

FIG. 34 shows a variant of the differential charge amplifier in accordance with FIG. 32. The inputs 161a and 161b are respectively connected to points Ea and Eb via capacitors C161a and C161b respectively and transistors T160a and T160b respectively. The control electrodes of transistors T160a and T160b are connected to a point 163 which carries a constant voltage VL. Points Ea and Eb are respectively connected to switching point 164 via capacitors C162a and C162b respectively in series with transistor T165. The control electrode of transistor T165 is connected to switching point 165. Points Ea and Eb are interconnected via transistor T167, whose control electrode is connected to a switching point 167. Moreover, point Ea is connected to point 164 via transistor T166, whose control electrode is connected to switching point 166.

FIG. 35 shows the clock signals φ165, φ167, φ166 and φ164 on points 165, 167, 166 and 164 respectively. At an intstant t0 all capacitors are charged to a reference level. Transistors T166 and T167 are then cut-off, transistor T165 is conductive and point 164 carries a low voltage. The mirror charges corresponding to the signal charges q1 and q2 on input 161a and 161b respectively can then flow to capacitors C162a and C162b respectively via capacitors C161a and C161b respectively and transistors T160a and T160b respectively, producing a signal voltage V1 and V2 across the first-mentioned capacitors. A subsequent negative signal charge is extracted from capacitor C162a and C161b respectively, which is fully in accordance with what has been described with reference to FIGS. 23–25. At instant t1 transistor T165 is turned off and transistor T167 is turned on, so that capacitors C162a and C162b are included in series between point 164 and point D. The signal voltage on point D then becomes equal to V1−V2 and can be sampled in the manner described. At instant t2 transistors T165 and T166 are turned on, while transistor T167 was already conductive, so that capacitors C162a and C162b are short-circuited and discharge to a reference level. By simultaneously applying a positive voltage pulse to point 164 capacitors C161a and C161b are re-charged to reference level.

The circuits of FIGS. 32 and 34 have the drawback that the capacitors C152a and C152b as well as the capacitors C162a and C162b should be identical, because the signal voltages V1 and V2 are determined by these capacitance values. Indeed, the one signal charge q1 produces a signal voltage V1=q1/C1 and the other signal charge a signal voltage V2=q2/C2, so that:

$$V1-V2=(q1/C1)-(q2/C2),$$

which is equivalent to $(1/C0)(q1-q2)$ if $C1=C2=C0$.

The circuit of FIG. 36 comprises inputs 171a and 171b which respectively via capacitor C171a and transistor T170a and via capacitor C171b and transistor T170b are connected to points Ea and Eb respectively. The control electrodes of the transistors T170a and T170b are connected to a point 173, which carries a constant voltage VL. Point Ea is connected to a switching point 174 via capacitor C172a in series with transistor T175. The control electrode of transistor T175 is connected to a switching point 175. Via capacitor C172b point Eb is connected to switching point 174. Via transistor T177a point Ea is connected to switching point 174, while via transistor T177b point Eb is connected to the point between capacitor C172a and transistor T175. The control electrodes of the transistors T177a and T177b are connected to a switching point 177.

In order to illustrate the operation of the circuit of FIG. 36, FIG. 37 shows the clock signals $\phi 175$, $\phi 177$ and $\phi 174$ on points 175, 177 and 174 respectively. At an instant t0 the capacitors C171a, C171b and C172a and C172b are charged to a reference level. Transistor T175 is conductive and transistors T177a and T177b are cut off. The positive signal charge $+q1$ or $+q2$ applied to input 171a and 171b respectively flows to capacitor C172a and C172b respectively as described with reference to the preceding Figures, while the subsequent negative signal charge $-q1$ or $-q2$ is taken from capacitors C171a and C171b respectively. At instant t1 transistor T175 is turned off and transistors T177a and T177b are turned on, so that capacitor C172a is connected in parallel (opposing) with capacitor C172b. The signal charges q1 and q2 on these capacitors are combined and a signal charge equal to $q2-q1$ remains on said parallel connection, which charge produces a signal voltage equal to $(1/CP)(q2-q1)$ on point Eb, Cp being the capacitance of the parallel connection of C172a and C172b. This signal voltage can be sampled as described previously. At instant t2 transistor T175 is turned on, so that capacitors C172a and C172b are short-circuited. By applying a positive voltage pulse to point 174 at the same instant, or later, the charge on capacitors C171a and C161b is also restored in the manner described with reference to the preceding Figures. After the cut-off of transistors T177a and T177b at instant t3 the circuit is ready again for a subsequent charge detection.

FIG. 38 shows an alternative for the differential charge amplifier of FIGS. 32, 34 and 36, the capacitors not being connected in series or parallel. To illustrate a possible use of a differential charge amplifier this Figure shows two charge coupled devices BBD1 and BBD2, in the present example bucket brigade memories. As is known they each comprise the series connection of a plurality of transistors, each with a capacitor between control electrode and drain electrode. In each of the BBD's one capacitor C181a or C181b forms part of the differential charge amplifier instead of being connected to the control electrode of the associated transistor. Similar uses are also possible with the differential charge amplifiers of FIGS. 32, 34 and 36 and for the nondestructive read-out of one BBD with the circuits of FIGS. 23, 26 and 29.

In the differential charge amplifier of FIG. 38 capacitors C181a and C181b are respectively connected to points Ea and Eb via transistors T180a and T180b respectively. The control electrodes of transistors T180a and T180b are connected to a switching point 183. Points Ea and Eb are respectively connected to a point of fixed potential (ground) via capacitors C182a and C182b respectively, Via transistor T185 point Ea is connected to output point 182 which via capacitor C183 is connected to a switching point 184. The control electrode of transistor T185 is connected to point Eb.

In order to illustrate the operation of the circuit of FIG. 38, FIG. 39 shows a signal q which represents one phase of the charge transfer of a charge q1 in BBD1 or of a charge q2 in BBD2 at the location of points 181a and 181b respectively and the clock signals $\phi 183$ and $\phi 184$ on switching points 183 and 184 respectively. At instant t1 a charge $+q1$ and $+q2$ in BBD1 and BBD2 respectively (p-channel) is transferred to capacitors C181a and C181b respectively, which are connected to points 181a and 181b respectively. The mirror charges q1 and q2 then flow to capacitors C182a and C182b via transistor T180a and T180b respectively with a "low" clock signal on the control electrode. If at instant t2 this charge q1 or q2 on points 181a and 181b respectively were to be transferred further by BBD1 and BBD2 respectively, this would not be possible, because the side of capacitor C181a or C181b facing transistors T180a and T180b respectively is connected to transistor T180a or T180b which is then not conductive, so that the voltage on these electrodes decreases by a value corresponding to said negative signal charge. At instant t2 transistors T180a and T180b are cut-off in order to prevent a premature restoration of the charge on capacitors C181a and C181b. To point 184 a positive pulse is applied. As a result of this capacitor C182a is charged further. When the voltage on point 184 decreases again at instant t3, capacitor C182a discharges to a level which is determined by the charge on capacitor C182b. When capacitors C182a and C182b are identical the net charge transfer to capacitor C183 is equal to $q1-q2$. At instant t4 the voltage on point 183 again decreases to VL. A subsequent restoration phase, for example with the circuit of FIG. 42, enables the BBD's to remove the charges q1 and q2 again, the corresponding mirror charges flowing to capacitors C181a and C181b.

Figure 40:
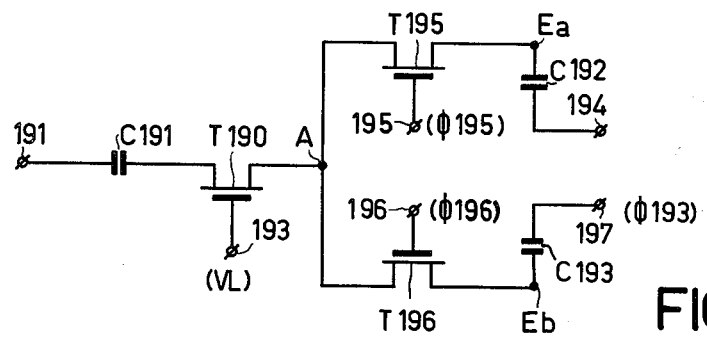
FIG. 40 shows a read-out circuit employing the inventive principle.

FIG. 40 shows an alternative for the circuit of FIG. 29 for storing both the positive and the negative mirror charge of capacitor C191. Via transistor T190, whose control electrode is connected to a point 193 carrying a fixed voltage VL, said capacitor C191 is connected to a point A. Via transistor T195, whose control electrode is connected to a switching point 195, to which a clock signal $\phi 195$ is applied, said point A is connected to a point Ea, which via a capacitor C192 is connected to a point 194 and via transistor T196, whose control electrode is connected to a switching point 196 to which a clock signal $\phi 196$ is applied, it is connected to a point Eb, which via a capacitor C193 is connected to a switching point 197 to which a clock signal $\phi 193$ is applied.

When a positive charge $+q$ is applied to capacitor C191 and transistor T195 is turned on, this charge $+q$ flows to capacitor C192, while point 194 may be connected to a point of fixed potential. The charge $-q$ subsequently appearing on capacitor C191 may be transferred to capacitor C193 by turning off transistor T195, turning on transistor T196 and applying a positive voltage pulse to point 197. As transistors T195 and T196 cannot conduct simultaneously, points 197 and 194 may also be interconnected.

In the foregoing it has been assumed that first the positive charge appears and then the negative charge. If the sequence is not known, a positive voltage pulse should also be applied to point 194 when transistor T195 is turned on.

Several variants are possible to the circuit of FIG. 40 as well as to, for example, the circuit of FIG. 8. As an example the threshold transistor T190 may be dispensed with when the low level of the clock signals on points 195 and 196 is employed as threshold, but the adverse effect of a difference between the threshold voltages Vth of transistors T195 and T196 then becomes greater. Alternatively threshold transistors, instead of a transistor T190 between point A and capacitor C191, may be included between point A and transistors T195 and T196, which threshold transistors can simply be formed by arranging an additional control electrode on the channels of the transistors T195 and T196.

Figure 41:
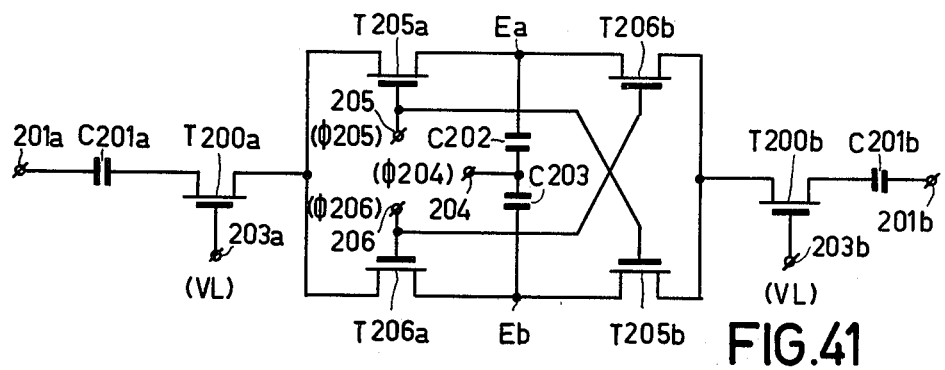
FIG. 41 shows the circuit of FIG. 40 extended to a differential charge amplifier.

FIG. 41 shows a differential charge amplifier using the principle in accordance with FIG. 40. This amplifier comprises two circuits in accordance with FIG. 40, including common capacitors C202 and C203, transistors T205a and T205b as well as transistors T206a and T206b being jointly switched by means of a clock signal $\phi 205$ ad $\phi 206$ respectively. A mirror charge corresponding to the charges q1 and q2 respectively applied to capacitors C201a and C201b (regardless of the polarity) is transferred to capacitors C202 and C203 respectively by turning on transistors T205a and T205b and applying a positive voltage pulse to point 204. The subsequent complementary mirror charge $-q1$ and $-q2$ is respectively transferred to capacitors C203 and C202 by turning on transistors T206a and transistors T206b and applying a positive voltage pulse to point 204. As a result of this the net charge transfer to capacitor C202 is $q1-q2$ and the net charge transfer to capacitor C203 is $q2-q1$.

Figure 42:
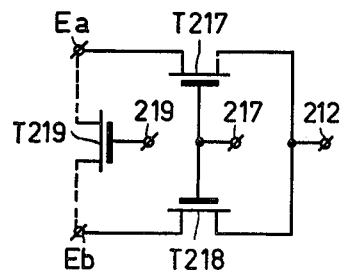
FIG. 42 shows a restoring circuit for use in the circuits of FIG. 38, 40 or 41.

FIG. 42 shows a possibility of a circuit for restoring the charge condition in the circuit arrangements of FIGS. 38, 40 and 41. For this purpose point Ea is connected to a point 212 via a transistor T217, whose control electrode is connected to switching point 217, and point Eb is connected to point 212 via a transistor T218, whose control electrode is connected to switching point 217. The charge on the capacitors (C182a, C182b, C192, C193, C202 and C203) connected to points Ea and Eb may be restored to a level V1 and the charge on the associated input capacitors C181a, C181b, C191, C201a and C201b) to the level V1 (the voltage on the control electrodes of transistors T180a, T180b, T190, T200a and T200b) when the switching transistors T180a, T180b, T195, T196, T205a, T205b, T206a, T206b conduct by applying a positive pulse to point 212 and reducing the voltage on point 217 to the level V1 (ignoring the threshold voltage of transistors T217 and T218), while level V1 should be lower than or equal to the level VL.

As in the circuits of FIGS. 40 and 41 the two mirror charges (+q and −q) have been transferred, the charge on the input capacitors C191, C201a and C201b is already restored at the end of the read-out process if any leakage discharges are ignored. In that case it suffices to restore the charge on capacitors C192, C193, C202 and C203, which may be effected in the various manners described, for example by applying a voltage V1 to point 212 and briefly turning on transistors T217 and T218.

In the circuits of FIGS. 40 and 41, the signal charge on capacitors C192 and C202 respectively is complementary to the signal charge on capacitors C193 and C203 respectively. In these circuits the charge in the one capacitor may be restored by means of the charge in the other capacitor, for which purpose points Ea and Eb may be short-circuited via a transistor T219. However, in order to restore charges which may have leaked away, it is preferred to effect a simultaneous restoration via transistors T217 and T218.

Figure 43:
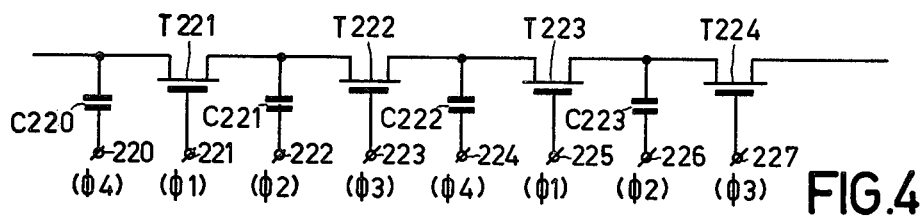
FIG. 43 shows a bucket brigade memory employing the inventive principle.

The principle of the invention may also be used for realizing a bucket brigade (BBD) or a charge coupled device (CCD) which is capable of transferring positive and negative signal charges. For this purpose it is not possible to merely connect a plurality of devices in accordance with FIG. 6 after each other, because in the circuit of FIG. 6 the reference level (Q1) on the output is lower than that (Q0) on the input (FIG. 7a). When the clock signal applied to point 44 is a three-level signal, "low" and "high" with an intermediate level, the reference level on the output 42 corresponding to that on the input (see charge situation in FIG. 7d) this is readily possible. FIG. 43 shows such a possibility.

FIG. 43 shows four stages of a delay line in accordance with the inventive principle, each stage including a transistor T221, T222, T223 and T224 respectively whose control electrode is connected to a switching point 221, 223, 225 and 227 respectively. A capacitor C220, C221, C222, C223 . . . is connected to the connecting point between each two transistors, the other ends of the capacitors being connected to a switching point 220, 222, 224 and 226 respectively.

Figure 44:
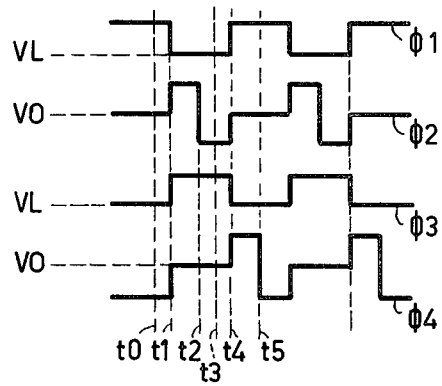
FIG. 44 shows the clock signals associated with the circuit of FIG. 43.
Figure 45:
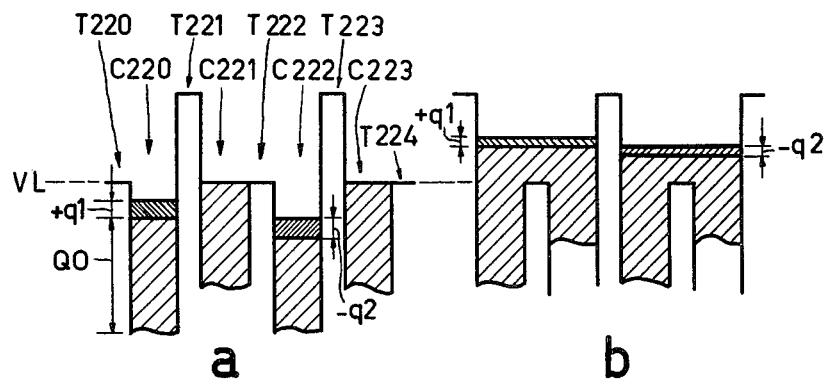
FIG. 45 represents the charge transfer in the circuit of FIG. 43.

FIG. 44 shows the clock signals $\phi 1$, $\phi 2$, $\phi 3$ and $\phi 4$ applied to the various switching points, the clock signal $\phi 1$ being applied to the control electrode of transistor T221 connected to the switching point 221 and the control electrode of every second subsequent transistor, the clock signal $\phi 2$ to the switching point of capacitor C221 and to the switching point connected to every second subsequent capacitor, clock signal $\phi 3$ to the control electrode of the transistor T222, which electrode is connected to switching point 223 and to the control electrode of every second subsequent transistor, and the clock signal $\phi 4$ to the switching point 224 and to the switching point connected to every second capacitor following capacitor C222. FIG. 45 shows the charge conditions at the instants t0, t1, t2 and t3 for the clock signals in accordance with FIG. 44.

At the instant t0 clock signal $\phi 1$ is "high" and $\phi 3$ is "low"; all transistors T221, T223 etc. are then cut off and transistors T220, T222, T224 etc. are conductive and at this instant the clock signal $\phi 2$ has the intermediate level V0 and clock signal 04 is low and all capacitors contain a reference charge $\phi 0$, capacitors C221, C223 etc., being charged to the level VL and the other capacitors to a low level. For the explanation of the operation of the circuit of FIG. 43 it is assumed that capacitor C220 contains a positive signal charge +q and capacitor C222 a negative signal charge −q. This situation is shown in 45a. At instant t1 transistor T221 and transistor T223 (as well as every second following transistor) are turned on with a threshold level VL and transistors T220, T222, T224 etc. are turned off. At the same time the voltage on points 222 and 226 is raised ($\phi 2$ high and the voltage on points 220, 224 etc. is brought at reference level V0). As a result of this capacitor C220 is charged from capacitor C221 and capacitor C222 from capacitor C223 (FIG. 45b). At instant t2 the voltage on point 222 and point 226 decreases, so that capacitors C220 and C222 respectively are discharged to a level VL to capacitors C221 and C223 respectively, so that the charges q1 and q2 are respectively transferred to capacitors C222 and C224, after which at instant t3 transistors T221 and T223 are turned off again (FIG. 45c). At instant t4 the voltage on points 222 and 226 is restored to a reference level V0 (FIG. 45d). The charge situation is then again as shown in FIG. 45a, but all signal charges have been transferred to the next capacitor. At the same instant the next phase may commence, the same cycle being repeated, shifted by one stage.

Figure 46:
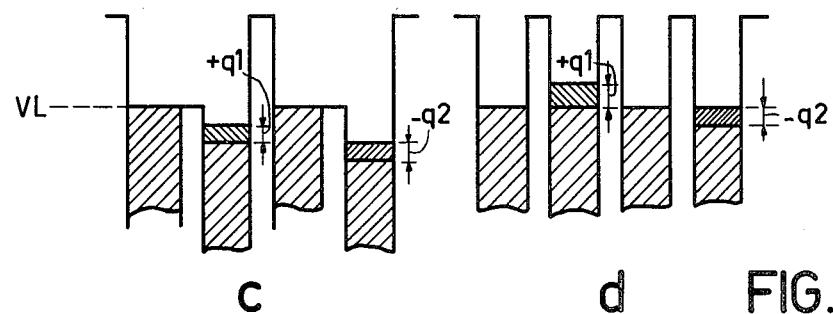
FIG. 46 shows a variant of the circuit of FIG. 43.

The circuit of FIG. 43 has the disadvantage that clock signals ($\phi$2 and $\phi$4) with three levels are required. FIG. 46 shows a variant employing clock signals with two levels only. The circuit is identical to that of FIG. 43, with the proviso that the clock signal for points 231, 235 and all subsequent points in that order, are dispensed with and that to these points a constant voltage VR is applied, which is higher than the low level VL of the clock signal $\phi$1 applied to the control electrodes of transistors T232, T234 etc., but lower than the high level.

Figure 47:
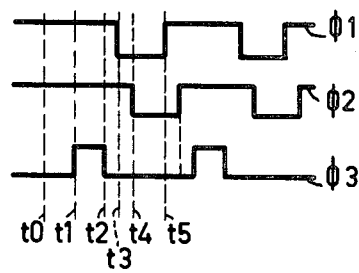
FIG. 47 shows the clock signals associated with the circuit of FIG. 46.
Figure 48:
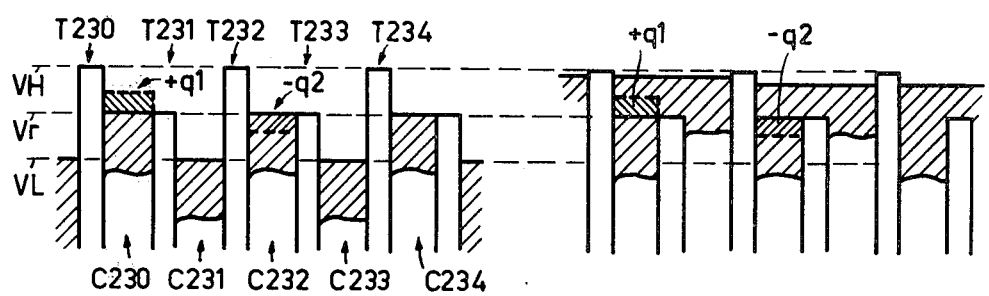
FIG. 48 represents the charge transfer in the circuit of FIG. 41.
Figure 48:
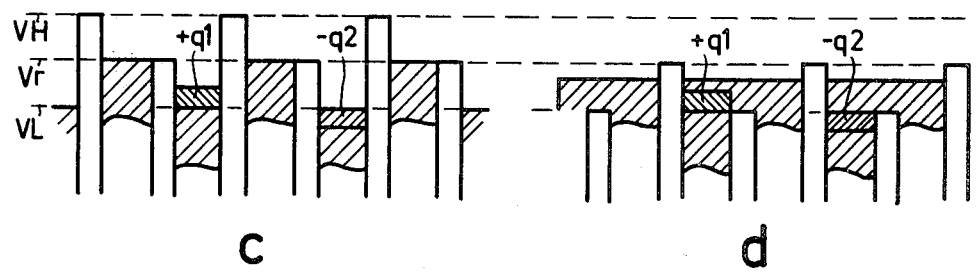
Figure 48:
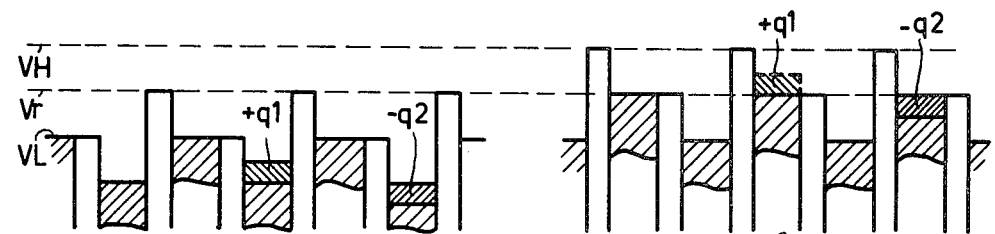

FIG. 47 shows the clock signal $\phi$1, $\phi$2 and $\phi$3 which is applied to points 233, 237 etc., 230, 234, 238 etc. and points 232, 236 etc. respectively and FIG. 48 shows the charge condition at the instants t0, t1, t2, t3, t4 and t5. At the initial instant t0 transistors T232 and T234 are cut off, the voltage on points 230, 234 and 238 is high and that on points 232 and 236 is low. It is assumed that at this instant a positive signal charge +q1 is present on capacitor C230 and a negative signal charge −q2 on capacitor C232 (FIG. 48a). The positive signal charge +q1 will then immediately flow away to capacitor C231 over threshold VR. At instant t1 the voltage on points 232, 236 and 238 is increased, so that capacitor C231 and C233 are charged above the threshold VR (FIG. 48b). At instant t2 the voltage on points 232 and 236 is reduced again, so that capacitors C230, C232 and C234 are discharged to a reference level VR. The signal charge +q1 and −q2 respectively has then been transferred to the next capacitor C231 and C233 respectively (FIG. 48c). At instant t3 transistors T230, T232 and T234 are turned on with a threshold VL which is sufficiently far below the threshold VR. Then charge flows from capacitors C230, C232 and C234 to the preceding capacitors C229, C231 and C233 respectively (FIG. 48d). At instant t4 the voltage in points 230, 234 and 238 decreases, so that capacitors C229, C231 and C233 are discharged to reference level VL and the signal charge +q1 and −q2 is transferred to capacitor C232 and 234 respectively (FIG. 48e). At instant t5 transistors T230, T234 and all second following transistors are turned off again and the voltage on points 230, 234 and 238 is increased again (FIG. 48f). The situation is then again as shown in FIG. 48a, the signal charges having been transferred two stages further and the reference charges on the various capacitors having been restored to the levels VL and VR respectively during said transfer.

The invention is not limited to the embodiments shown. Various variants are possible. Instead of p-channel transistors n-channel transistors may be employed. A combination of p and n-channel transistors is possible, in particular in the differential charge amplifiers described. Alternatively, the inventive principle may be applied in conjunction with bipolar transistors. When insulated gate field effect transistors are used the techniques known from charge coupled devices (CCD), such as the formation of the various transistors as well as the various capacitors by providing one channel with a plurality of insulated electrodes, may also be used. Moreover, the clock signals, chosen by way of example in the various embodiments, may have different shapes.

What is claimed is:

1. A method of transferring a signal charge from a first capacitance having an initial reference charge to a first point via a transistor circuit which exhibits a first threshold level, at least during said transfer to the first point, said signal charge being within a range of values such as to either add to or subtract from said initial reference charge on said first capacitance, and comprising a first phase in which the transistor circuit is biased such that charge transfer from the first point to the first capacitance is effected in such a way that the first capacitance is charged to at least said threshold level from said first point, and a second phase in which the transistor circuit is biased such that the first capacitance is discharged to said threshold level towards the first point.

2. A charge transfer device for transferring a signal charge, which comprises a first point, a first capacitance having an initial reference charge, said signal charge being within a range of values such as to either add to or subtract from said initial reference charge, a transistor circuit connected between the first capacitance and the first point and having a first threshold level, and clock signal means for biasing the transistor circuit during a first phase such that a charge transfer is effected from the first point to the first capacitance to charge said first capacitance to at least said first threshold level from said frist point, and for biasing the transistor circuit during a second phase in such a way that the first capacitance discharges towards said first point to said threshold level which is determined by the transistor circuit during said second phase.

3. A device as claimed in claim 2, characterized in that the transistor circuit comprises a first transistor having a first and a second main electrode and a control electrode, the first main electrode being connected to the first capacitance, the second main electrode being connected to the first point and the control electrode being connected to a first source of voltage during at least said second phase so as to define said threshold level, the clock signal means comprising a source of switching voltage, which source is coupled to the first point for biasing said first point during the first phase to such a voltage that charge transfer is effected from the first point to the first capacitance and for biasing said first point during the second phase to such a voltage that charge transfer from the first capacitance to said first point is effected over said threshold level.

4. A device as claimed in claim 3, characterized in that a second capacitance is included between the first point and said first source of switching voltage.

5. A device as claimed in claim 3 or 4, characterized in that the clock signal means comprise a second source of switching voltage, which second source is coupled to the control electrode of the first transistor for switching the first transistor to said threshold level during the second phase and for turning off the first transistor during a third phase preceding the first phase.

6. A device as claimed in claim 3 or 4, characterized in that between the first point and the first capacitance a second transistor is included in series with the first transistor and that the clock signal means comprise a second source of switching voltage, which second source is coupled to the control electrode of the second transistor for turning on the second transistor during the first and the second phase and turning off the second transistor during a third phase preceding the first phase.

7. A device as claimed in claim 2, characterized in that the transistor circuit comprises a first transistor with a first and a second main electrode and a control electrode, the first main electrode being connected to a second point via the first capacitance, the second main electrode being connected to the first point and the control electrode being connected to a third point, and the clock signal means comprising a first source of switching voltage, which source is coupled to the second and the third point for switching the voltage on its second and third point to such levels during the first phase that charge transfer from the first point to the first capacitance is possible during said first phase and switching the voltage on the second and third point to such levels during the second phase that charge transfer from the first capacitance to the first point is possible, said threshold level being determined by the voltage on the third point during the second phase.

8. A device as claimed in claim 7, characterized in that the first point is connected to a point of fixed voltage via a second capacitance.

9. A device as claimed in claim 7 or 8, characterized in that the clock signal means are adapted to turn off the first transistor during a third phase occurring outside the first and the second phase.

10. A device as claimed in claim 7 or 8, characterized in that between the first point and the first capacitance a second transistor is included in series with the first transistor and that the clock signal means comprise a second source of switching voltage, which second source is coupled to the control electrode of the second transistor for turning on said second transistor during the first and the second phase and turning off the second transistor during a third phase situated outside the first and the second phase.

11. A device as claimed in Claim 2, characterized in that the first capacitance is connected to a signal charge input with the side which faces the transistor circuit.

12. A device as claimed in claim 2, characterized in that the first capacitance is connected to a signal charge input with the side which is remote from the transistor circuit.

13. A device as claimed in claim 3, characterized in that the control electrode of the first transistor, at least during the second phase, is connected to a signal voltage input, so that said threshold level is determined by said signal voltage.

14. A device as claimed in claim 3, characterized in that a third capacitance is connected to the control electrode of the first transistor, which third capacitance is coupled to a signal input for receiving a signal charge.

15. A device as claimed in claim 11, characterized in that between the said signal charge input and the first capacitance there is included a transistor switch, which is coupled to the clock signal means in such a way that said switch is non-conductive during the first and the second phase and is conductive during a phase prior to the first phase.

16. A device as claimed in claim 15, characterized in that the first point is connected to the input of a sampling circuit.

17. A device as claimed in claim 16, characterized in that the fourth point is connected to the clock signal means for shifting the level of the voltage on the first point during a third phase preceding the second phase.

18. A device as claimed in claim 17, characterized in that the sampling circuit comprises a third transistor with a control electrode and a first and a second main electrode, the control electrode being connected to the first point, the first main electrode to an output and to a third capacitance, and the second main electrode to a switching point which is coupled to the clock signal means in such a way that during a third phase following the second phase the voltage on said switching point is switched so that charge transfer is possible from said switching point to the third capacitance and during a fourth subsequent phase in such a way that the third capacitance can discharge to a level determined by the charge on the second capacitance.

19. A device as claimed in claim 5, characterized in that the first capacitance with the side which faces the first transistor is connected to a signal input via a third transistor, whose control electrode is connected to a point of fixed voltage, and a third capacitance, said fixed voltage being selected so that during the first phase the third capacitance also receives charge from the first point and during the second phase discharges to the first point to a level determined by the fixed voltage.

20. A device as claimed in claim 19, characterized in that the first capacitance is connected to the input of a sampling circuit for sampling the charge on the first capacitance during a phase preceding the first phase.

21. A device as claimed in claim 20, characterized in that the sampling circuit comprises a fourth transistor with a control electrode and a first and second main electrode, the control electrode being connected to the side of the first capacitance which faces the first transistor, the first main electrode to an output and to a fourth capacitance, and the second main electrode to a switching point which is coupled to the clock signal means, in such a way that during the said phase preceding the first phase the voltage on said switching point is switched so that first a charge transfer from the switching point to the fourth capacitance is possible and that subsequently the fourth capacitance can discharge to the switching point to a level determined by the charge on the first capacitance.

22. A device as claimed in claim 12, characterized in that via a third transistor the first point is connected to a point at such a voltage that during conduction of the third transistor the first and the second capacitance can be charged to said voltage, the control electrode of the third transistor being coupled to the clock signal means for turning on the transistor during a phase preceding the first phase.

23. A device as claimed in claim 22, characterized in that the first point is connected to the input of a sampling circuit for sampling the voltage on the second capacitance during a phase following the second phase.

24. A device as claimed in claim 12, characterized in that via a third transistor the first point is connected to a fourth point, of which third transistor the control electrode is connected to the clock signal means for turning off the third transistor during the first and the second phase, that a fourth capacitance is connected to the fourth point, and that via a fourth transistor the fourth point is connected to a fifth point, the control electrode of the fourth transistor being connected to the clock signal means for turning off the transistor during the first and the second phase, the fourth transistor being turned on during a phase preceding the first phase and the fifth point receiving such a voltage that the first, second and third capacitance are charged to said voltage above the threshold constituted by the first, third and fourth transistor, after which the voltage on said fifth point is switched to such a voltage that the first capacitance discharges to said fifth point to a threshold level determined by the first transistor, the second capacitance to a level determined by the third transistor and the third capacitance to a level determined by the fourth transistor.

25. A device as claimed in claim 24, characterized in that the control electrode of the third transistor is connected to the side of the second capacitance which is remote from the first point.

26. A device as claimed in claim 24 or 25, characterized in that the third point is connected to a first sampling circuit and that the fourth point is connected to a second sampling circuit.

27. A device as claimed in claim 2 or 3, characterized by first means for causing signal charge to be applied from a first input to the first capacitance during a third phase preceding the first phase, a second capacitance, second means for causing signal charge to be applied from a second input to the second capacitance during the third phase, switching means for connecting the first and the second capacitance in series during a fourth phase situated between the third and the first phase, and switching means for coupling the second capacitance to the first point during the first and the second phase.

28. A device as claimed in claim 2 or 3, characterized by first means for causing signal charge to be applied from a first input to the first capacitance during a third phase preceding the first phase, a second capacitance, second means for causing signal charge to be applied from a second input to the second capacitance during the third phase, first switching means for connecting the first and the second capacitance in parallel during a fourth phase situated between the first and the third phase, and second switching means for coupling the second capacitance to the first point during the first and the second phase.

29. A device as claimed in claim 28, characterized in that the first means comprises a second transistor, of which a first main electrode is connected to the first capacitance, the second main electrode to the first signal input via a third capacitance, and the control electrode to point of constant potential, and that the second means comprise a third transistor, of which a first main electrode is connected to the second capacitance, the second main electrode to the second signal input via a fourth capacitance, and the control electrode to a point of constant potential.

30. A device as claimed in claim 29, characterized in that the first capacitance is included between the first and the second transistor, the second capacitance between the third transistor and the first point and the first and second switching means comprise a fourth and fifth transistor for the cross-wise connection of the electrodes of the first and the second capacitance during the fourth, first and second phase, the first transistor being turned off during the fourth phase.

31. A device as claimed in claim 30, characterized in that the connecting point between the second capacitance and the third transistor is connected to the input of a sampling circuit for sampling the voltage on said point during the fourth phase.

32. A device as claimed in claim 21, characterized in that the first and the second capacitance are connected to the first point via a fourth transistor with the side which is remote from the second and the third transistor, the control electrode of said fourth transistor being connected to a point of constant potential, and that the first and second switching means are constituted by a fifth transistor, which is included between the side of the second capacitance that faces the third transistor and the first point.

33. A device as claimed in claim 21, characterized in the first capacitance is included between the first and the second transistor, the second capacitance is included between the third transistor and the first point, that the first switching means are constituted by a fourth transistor included between the first main electrodes of the second and third transistor, which fourth transistor is also turned on during the first and the second phase and that the second switching means are constituted by a fifth transistor which is connected in parallel with the first capacitance.

34. A device as claimed in claim 32, characterized in that the connecting point between the first transistor and the first capacitance is connected to the input of a sampling circuit for sampling the voltage on said point during the fourth phase.

35. A device as claimed in claim 4, characterized by a first signal input which is coupled to a fourt point between the first capacitance and the first transistor, a second signal input which is coupled to a fifth point, a third capacitance between the fifth point and the second point of fixed potential, the first capacitance being included between said second point of fixed potential and the fourth point, and the fifth point being coupled to the control electrode of the first transistor.

36. A device as claimed in claim 8, characterized by a first signal input which is coupled to a fourth point between the first capacitance and the first transistor, a second signal input which is coupled to the third point which is connected to the control electrode of the second transistor, a third capacitance between the second point, which via the first capacitance is connected to the fourth point, and the third point, the second point being connected to said first source of switching voltage.

37. A device as claimed in claim 35 or 36, characterized in that between the first signal input and the fourth point there are included in this order a third capacitance and a third transistor and between the second signal input and the third point there are included in this order a fourth capacitance and a fourth transistor, the control electrodes of the third and fourth transistor being coupled to the clock signal means for turning off the third and the fourth transistor during the first and the second phase.

38. A device as claimed in claims 35 or 36, characterized in that the third point is connected to a fifth point via a fifth transistor and the fourth point is connected to the fifth point via a sixth transistor, of which sixth and fifth transistors the control electrodes are connected to the clock signal means for turning on the sixth and the fifth transistor during a fourth phase following the second phase.

39. A device as claimed in claim 4, characterized in that the second transistor is included between the first transistor and the first point, a third transistor between the connecting point of the first and the second transistor and a third point, which third point via a third capacitance is connected to a second point, that the second capacitance is included between the first point and the fifth point, and that the first capacitance is included between an input terminal and a fourth point, the control electrode of the third transistor being connected to clock signal means for turning on the third transistor during the third phase.

40. A device as claimed in claim 39, characterized in that the second point is connected to the fourth point, which fourth point is connected to said first source of switching voltage.

41. A device as claimed in claim 40, characterized by a first and a second device as claimed in claim 40, of which first device the first capacitance is the same as the third capacitance of the second device and the third capacitance is the same as the first capacitance of the second device, the control electrode of a second transistor of the first device being connected to the control electrode of the third transistor of the second device and the control electrode of the third transistor of the first device being connected to the control electrode of the second transistor of the second device.

42. A device as claimed in claim 39, characterized in that between the first and the third point there is included a fourth transistor, whose control electrode is connected to the clock signal means for turning on said transistor during a fourth phase so as to restore the charge on the first and the second capacitance.

43. A device as claimed in claim 42, characterized in that the first point is connected to a fifth point via a fifth transistor and the third point via a sixth transistor, of which fourth and fifth transistor the control electrodes are connected to the clock signal means for turning on the fourth and the fifth transistor during the fourth phase.

44. A device as claimed in claim 38, characterized in that the fifth point carries a constant potential.

45. A device as claimed in claim 38, characterized in that the fifth point is connected to the clock signal means for pulsing the voltage on the fifth points during the fourth phase.

46. A device as claimed in claim 39, characterized in that at least the first point is connected to the input of a sampling circuit.

47. A device as claimed in claim 46, characterized in that the third point is connected to the input of a sampling circuit.

48. A device as claimed in claim 31, characterized in that the sampling circuit comprises a sixth transistor with a control electrode and a first and a second main electrode, the control electrode being connected to the input of a sampling circuit, the first main electrode to an output and to a fifth capacitance, and the second main electrode to a switching point which is coupled to the clock signal means in such a way that during the third phase the voltage on said switching point is switched so that first a charge transfer from said switching point to the fifth capacitance is possible and that subsequently the fifth capacitance of said switching point can discharge to a level which is determined by the voltage appearing on the input.

49. A device as claimed in claim 2, characterized in that in conjunction with a plurality of similar devices it constitutes a series connection, the first point of every device being coupled to the first capacitance of a subsequent device, the devices alternately belonging to a first and a second group and being jointly coupled to the clock signal means of each group, the first phase in the first group following the second phase in the second group and the first phase in the second group following the second phase in the first group.

50. A device as claimed in claim 49, characterized in that the device comprises first transistors, which all belong to the first group and whose control electrodes are connected to a second point, second transistors which all belong to the second group and whose control electrodes are connected to a fourth point, which first and second transistors are alternately connected in series, first capacitors which all belong to the first group and which are each time connected to the connecting point between a first transistor and a second transistor and to a third point, and second capacitors which all belong to the second group and which are each time connected to the connecting point between a second and a first transistor and to a fifth point.

51. A device as claimed in claim 50, characterized in that the second, third, fourth and fifth point are connected to the clock signal means, in such a way that consecutively the first and second transistors are alternately turned on with a predetermined threshold level, that during conduction of the first transistors the voltage on the fifth point is at a reference value and that the voltage on the third point relative to the reference value is switched so that first a charge transfer is effected from the first capacitances to the second capacitances via the first transistors and subsequently charge transfer is effected from the second capacitances to the first capacitances over the threshold constituted by the first transistors and that during conduction of the second transistors the voltage on the third point is at said reference value and that the voltage on the fifth point relative to said reference value is switched so that first a charge transfer is effected from the second capacitances to the first capacitances via the second transistors and subsequently charge transfer is effected from the first capacitances to the second capacitances over the threshold constituted by the second transistors.

52. A device as claimed in claim 50, characterized in that the fourth point is connected to a point of constant potential and that the second, third and fifth point are connected to the clock signal means in such a way that consecutively the first transistors are conductive in the first period with a first threshold level and are cut-off in a second period, the second threshold level of the second transistors caused by the potential non the fourth point being situated between the first threshold level and the threshold level formed by the first transistors during the second period, that during the first period the voltage on the third point is switched so that first a charge transfer is effected from the first capacitances to the second capacitances via the first transistors and subsequently charge transfer is effected from the second capacitances to the first capacitances over the first threshold level constituted by the first transistors and that during the second period the voltage on the fifth point is switched so that first a charge transfer is effected from the second capacitances to the first capacitances via the second transistors and subsequently charge transfer is effected from the first capacitances to the second capacitances over the threshold level constituted by the second transistors.

53. A device as claimed in claim 27, characterized in that the first means comprises a second transistor, of which a first main electrode is connected to the first capacitance, the second main electrode to the first signal input via a third capacitance, and the control electrode to point of constant potential, and that the second means comprise a third transistor, of which a first main electrode is connected to the second capacitance, the second main electrode to the second signal input via a fourth capacitance, and the control electrode to a point of constant potential.

* * * * *